(12) United States Patent
Kunikiyo

(10) Patent No.: US 6,222,217 B1
(45) Date of Patent: *Apr. 24, 2001

(54) SEMICONDUCTOR DEVICE AND MANUFACTURING METHOD THEREOF

(75) Inventor: Tatsuya Kunikiyo, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/138,568

(22) Filed: Aug. 24, 1998

(30) Foreign Application Priority Data

Nov. 27, 1997 (JP) .................................... 9-326393

(51) Int. Cl.⁷ .................. H01L 27/108; H01L 29/76; H01L 29/94; H01L 31/119
(52) U.S. Cl. .................. 257/296; 257/303; 257/306; 257/307
(58) Field of Search .................. 257/296, 303, 257/297–299, 310–311, 295, 306, 307

(56) References Cited

U.S. PATENT DOCUMENTS

| | | | |
|---|---|---|---|
| 5,103,285 | * | 4/1992 | Furumura et al. .................. 257/77 |
| 5,492,853 | * | 2/1996 | Jeng et al. .................. 438/666 |
| 5,506,166 | | 4/1996 | Sandhu et al. . |
| 5,510,630 | | 4/1996 | Agarwal et al. . |
| 5,852,307 | * | 12/1998 | Aoyama et al. .................. 257/295 |
| 5,859,451 | * | 1/1999 | Narita .................. 257/306 |

FOREIGN PATENT DOCUMENTS

| | | |
|---|---|---|
| 4-49654 | 2/1992 | (JP) . |
| 8-335681 | 12/1996 | (JP) . |

* cited by examiner

*Primary Examiner*—Tom Thomas
*Assistant Examiner*—Thien F. Tran
(74) *Attorney, Agent, or Firm*—Oblon, Spivak, McClelland, Maier & Neustadt, P.C.

(57) ABSTRACT

A semiconductor device capable of restraining a leakage current at an n-p junction of source/drain regions and a manufacturing method of the semiconductor device. A trench is formed in the source/drain regions, a main surface of the source/drain regions is removed at a time of forming the trench and a surface area of the source/drain regions is increased as compared with that before forming the trench. In this manner, a stress per unit area concentrated on the source/drain regions in the vicinity of ends of an isolating oxide film is reduced, and any occurrence of minute defects is restrained. As a result, leakage current caused by any minute defects due to the stress is reduced, and a refresh pause time is prolonged, and in other words, characteristics of a refresh operation can be improved.

3 Claims, 20 Drawing Sheets

SEMICONDUCTOR DEVICE AND MANUFACTURING METHOD THEREOF

BACKGROUND OF THE INVENTION

1. Field of the Invention

The present invention relates to a semiconductor device and a manufacturing method thereof and, more particularly, to a semiconductor device which restrains a leakage current in a n-p junction or a capacitor insulating film of a memory cell of a DRAM (Dynamic Random Access Memory), and to a manufacturing method thereof.

2. Description of the Background Art

Semiconductor memories are generally classified into three types: a DRAM (Dynamic Random Access Memory), a flash memory, and a SRAM (Static Random Access Memory). In the DRAM, data are refreshed and stored therein constantly, but when power is shut off thereto, the data once stored are lost. In the flash memory, data are perpetually stored therein and never lost even if power is shut off thereto. Therefore, the flash memory is referred to as a non-volatile memory. In the SRAM, data are not required to be refreshed, and when power thereto is shut off, the data once stored are lost. In this manner, each type of these semiconductor memories has its own characteristics, and is selected for use in conformity with their characteristics.

The DRAM is a leading memory occupying a greater production quantity of semiconductor memories at present. A DRAM includes a memory cell array serving as a storage region for storing a large quantity of storage information, and a peripheral circuit section for performing a predetermined input/output operation with respect to the memory cell array. The memory cell array further includes a plurality of memory cells arranged to perform as a minimum storage unit. Each memory cell basically includes a capacitor, and a MOS (Metal Oxide Semiconductor) transistor. In operation, whether or not a certain charge is stored in the capacitor is judged, and the judgment is associated with data of "0" and "1", whereby the storage information is processed.

FIG. 34 shows an equivalent circuit of a memory cell of a background DRAM and in which reference numeral 201 designates a capacitor, and numeral 202 designates a cell transistor. The capacitor 201 and the cell transistor 202 form a memory cell 200. Numeral 203 is a bit line, numeral 204 is a word line, and numeral 205 is a sense amplifier. As shown in FIG. 34, the capacitor 201 is connected to one of source/drain regions of the cell transistor 202, and the bit line 203 is connected to the other of source/drain regions of the cell transistor 202. Further, a gate electrode of the cell transistor 202 is connected to the word line 204, and the bit line 203 is connected to the sense amplifier 205.

The term "source/drain" is used herein because this element serves as a "source" to supply a carrier or as a "drain" to remove a carrier, depending on read or write of information.

FIG. 35 is a sectional view showing a construction of a background memory cell of which partially hidden parts are indicated by broken lines. In FIG. 35, reference numeral 101 is a semiconductor substrate, numeral 102 is an isolating oxide film forming a STI (Shallow Trench Isolation) in which one element is electrically insulated from other elements. Numeral 103 is a gate oxide film, and numeral 104 is a gate electrode forming the word line 204. Numerals 105 and 106 are source/drain regions formed on left and right sides under the gate electrode 104. Numeral 107 is a side wall which is an insulating film coating the gate electrode 104. Numeral 1010 are polysilicon plugs, one of which is connected to the drain region 106, and another of which is connected to a storage node contact 1017 later described. Numeral 1011 are polysilicon plugs, one of which is connected to the source region, and another of which is connected to the bit line 203 indicated by broken lines in FIG. 35. Numerals 1012 and 1013 are silicon oxide films and numeral 1014 is a silicon nitride film.

These elements 1012–1014 form an interlayer insulating film. Numeral 1015 is a trench which is provided in such a manner to be open in the interlayer insulating film. Numeral 1017 is a storage node contact formed in the trench 1015. Numeral 1019 is a storage node, numeral 1020 is a capacitor insulating film, and numeral 1021 is a cell plate. The capacitor insulating film 1020 is made of a nitride titanium film (TiN) and a tantalum oxide film ($Ta_2O_5$) formed on the surface thereof. The cell plate 1021 is composed of a polysilicon which includes n-type impurities. A capacitor 1022 is formed by the storage node 1019, the capacitor insulating film 1020 and the cell plate 1021.

A charge stored in the capacitor 201 as a storage information is gradually discharged due to a leakage current in the n-p junction between the source/drain regions 105, 106 and the semiconductor substrate 101 or in the capacitor insulating film 1020, etc. An operation of timely injecting a charge is required in order to maintain storage in the DRAM. This operation is called a "refresh", in which information written in the capacitor 201 is judged by the sense amplifier 205. That is, the read or write of information is performed so that a new charge is supplied when it is judged that a charge is injected in the capacitor 201, and that the charge is exhausted in the capacitor 201 when it is judged that no charge is injected.

In addition, the refresh is performed by applying a voltage to the selected gate electrode 104 and the source/drain region 105 and by performing the read or write of the information stored in the capacitor 201, as mentioned above.

In the background semiconductor device, however, information is lost due to generation of leakage current from the n-p junction of the storage node, the storage node contact and the source/drain region, in addition to the loss of information due to this read operation. In view of preventing the loss of information due to the leakage current, there has been a problem that the refresh must be performed on the information stored in every memory cell within a relatively short period of about 1 msec to several hundred msec. This refresh results in an increase in power consumption.

There has been another problem that, as the information stored in the memory cells cannot be read during the refresh, a refresh interval (refresh pause time) is shortened. If the refresh pause time is short, efficiency of data use per operating time is lowered.

There has been a further problem that minute defects are produced around the end of the isolating oxide film due to a stress caused by a difference in the coefficient of cubic expansion between the semiconductor substrate and the isolating oxide film, and a leakage current is generated due to such minute defects, which also shortens the refresh pause time.

SUMMARY OF THE INVENTION

The present invention has been made to solve the above-discussed problems and has as one object to provide a novel semiconductor device capable of restraining a leakage current of a n-p junction of a source/drain region and a manufacturing method thereof.

Another object of the present invention is to provide a novel semiconductor device capable of restraining a leakage current caused by minute defects produced due to stress around an end of an isolating oxide film and a manufacturing method thereof.

A further object of the present invention is to provide a novel semiconductor device capable of restraining a leakage current of a capacitor insulating film flowing through a storage node contact and a manufacturing method thereof.

A novel semiconductor device according to the present invention includes a semiconductor substrate. An isolating oxide film is formed on an isolated region of a main surface of the semiconductor substrate. A pair of source/drain regions is formed in an active region surrounded by the isolated region of the main surface of the semiconductor substrate. A trench is formed in the source/drain regions. A gate electrode is formed on the main surface of the active region of the semiconductor substrate through an insulating film. An interlayer insulating film is formed to coat the isolating oxide film, the source/drain regions, the trench, and the gate electrode. A wiring layer reaches the trench through an opening provided on the interlayer insulating film, and a capacitor is connected to either of the source/drain regions through the wiring layer.

In the mentioned novel semiconductor device, since the trench is formed in the source/drain regions, the main surface of the source/drain regions is removed at the time of forming the trench, and a surface area of the source/drain regions is increased as compared with that before forming the trench. Accordingly, a stress per unit area concentrated on the source/drain regions in the vicinity of ends of the isolating oxide film is reduced, and an occurrence of minute defects is restrained. As a result, any leakage current caused by minute defects due to stress is reduced, and the refresh pause time is prolonged, in other words, characteristics of refresh can be improved.

A novel semiconductor device in another aspect of the present invention also includes a semiconductor substrate. An isolating oxide film is formed on an isolated region of a main surface of the semiconductor substrate. A pair of source/drain regions is formed in an active region surrounded by the isolated region of the main surface of the semiconductor substrate. A gate electrode is formed on the main surface of the active region of the semiconductor substrate through an insulating film. An interlayer insulating film is formed to coat the isolating oxide film, the source/drain regions, the trench, and the gate electrode. A wiring layer is formed by filling up a contact hole reaching the source/drain regions through an opening provided on the interlayer insulating film. A capacitor is connected to either of the source/drain regions through the wiring layer, and a film for restraining a leakage current is formed in the wiring layer apart from the capacitor.

In the mentioned novel semiconductor device, since the film for restraining a leakage current is formed at a portion isolated from the capacitor in the wiring layer connecting the capacitor and the source/drain regions, the leakage current is restrained from flowing between the capacitor and the source/drain regions when no voltage is applied, and thus the refresh pause time can be prolonged.

A novel manufacturing method of a semiconductor device according to the present invention includes a step of forming an isolating oxide film on an isolated region of a main surface of a semiconductor substrate. A gate electrode is formed on the main surface of the semiconductor substrate through an insulating film. A pair of source/drain regions is formed in an active region surrounded by the isolated region of the principal surface of the semiconductor substrate. A side wall is formed on a side of the gate electrode. A trench is formed by etching the principal surface of the source/drain regions. A first wiring layer is formed by filling up the trench with a first conductive material. An interlayer insulating film is formed to coat the isolating oxide film, the source/drain regions, the trench, and the gate electrode. An opening is formed to reach from a surface of the interlayer insulating film to a surface of the first wiring layer. A second wiring layer is formed by filling up the opening with a second conductive material, and a capacitor is formed to be connected to either of the source/drain regions through the first and second wiring layers.

In the mentioned novel manufacturing method of the semiconductor device, since the trench is formed on the surface of the source/drain regions, stress concentrated on the source/drain region in the vicinity of the end of the isolating oxide film and on the semiconductor substrate is reduced, and any occurrence of minute defects is restrained. As a result, any leakage current caused by minute defects due to the stress is reduced, and the refresh pause time is prolonged, in other words, characteristics of refresh can be improved.

A novel manufacturing method of a semiconductor device in another aspect of the present invention also include a step of forming an isolating oxide film on an isolated region of a main surface of a semiconductor substrate. A gate electrode is formed on the main surface of the semiconductor substrate through an insulating film. A pair of source/drain regions is formed in an active region surrounded by the isolated region of the main surface of the semiconductor substrate. A side wall is formed on a side of the gate electrode. An interlayer insulating film is formed to coat the isolating oxide film, the source/drain regions, the trench, and the gate electrode. An opening is formed for forming a wiring layer connected electrically to either of the source/drain regions on the interlayer insulating film. A first wiring layer of the wiring layer is formed by filling up to a halfway of the opening with a first material, a second wiring layer of the wiring layer is formed on the first wiring layer formed on the opening by filling up to a halfway of the opening with a second material, and a third wiring layer of the wiring layer is formed on the second wiring layer formed on the opening by filling up with the first material. A capacitor is formed to be connected electrically to the wiring layer including the first, second, and third wiring layers.

In the mentioned novel manufacturing method of the semiconductor device, since the film for restraining the leakage current is formed at a portion isolated from the capacitor in the wiring layer connecting the capacitor and the source/drain regions, leakage current is restrained from flowing between the capacitor and the source/drain regions when no voltage is applied, and thus the refresh pause time can be prolonged.

BRIEF DESCRIPTION OF THE DRAWING

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

A semiconductor device according to a first preferred embodiment of the present invention and a manufacturing method thereof are hereinafter described.

Figure 1:
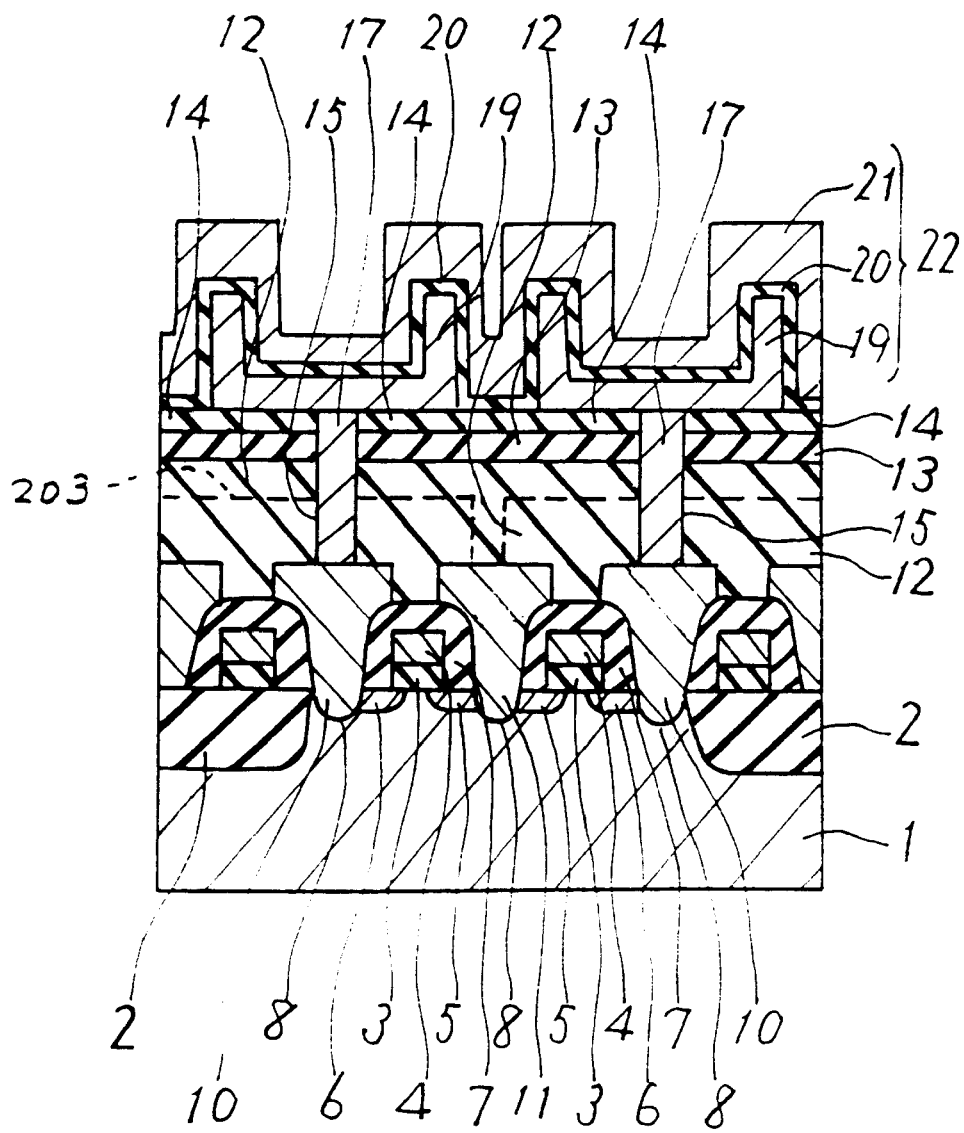
FIG. 1 is a sectional view showing a construction of a semiconductor device according to a first preferred embodiment of the present invention, and in which partially hidden parts are indicated by broken lines.
Figure 34:
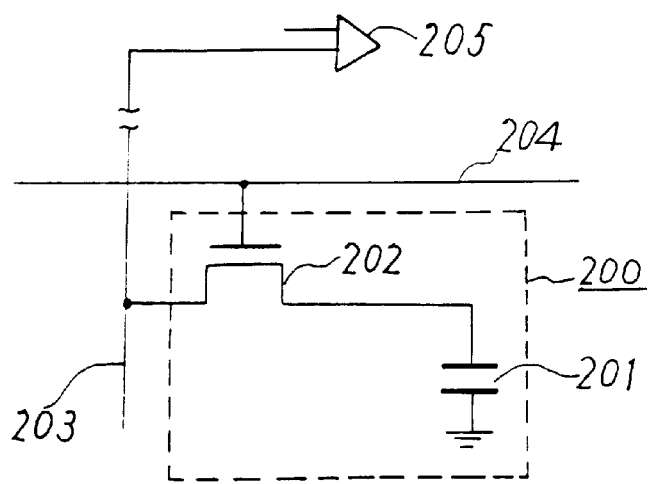
FIG. 34 is a diagram showing an equivalent circuit of a memory cell of a semiconductor device according to background art.
Figure 35:
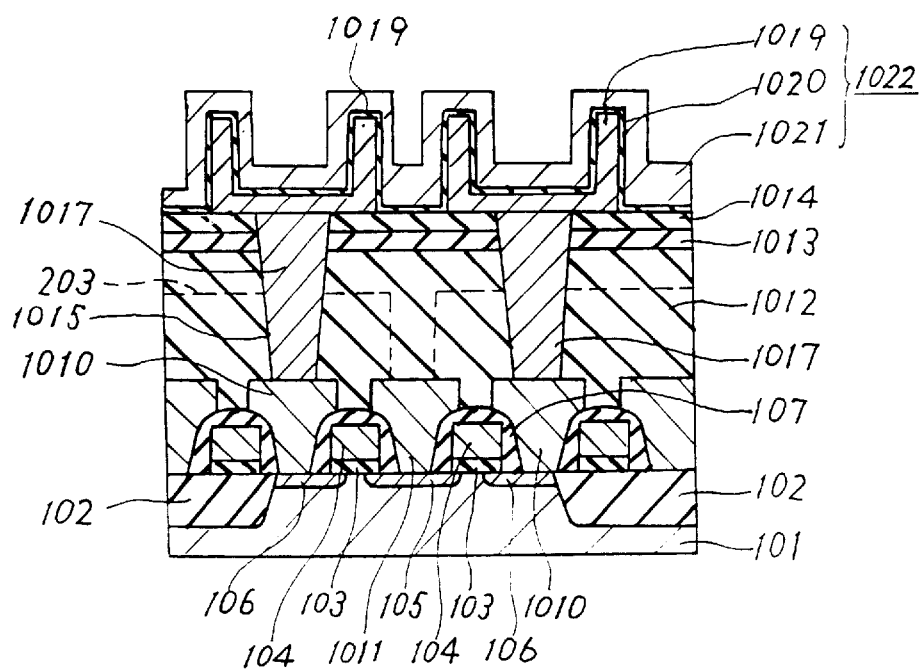
FIG. 35 is a sectional view showing a construction of a memory cell according to the background art, and in which partially hidden parts are indicated by broken lines.

FIG. 1 is a sectional view showing a construction of a semiconductor device according to a first preferred embodiment of the present invention, and in which partially hidden parts are indicated by broken lines. An equivalent circuit of a memory cell of a DRAM which is a semiconductor device according to the present invention is the same as the circuit shown in FIG. 34. Referring to FIG. 1, reference numeral 1 designates a p-type semiconductor substrate, numeral 2 designates an isolating oxide film for electrically insulating one element from another and which is formed on an isolated region of a main surface of the semiconductor substrate 1. Numeral 3 is a gate oxide film, numeral 4 is a gate electrode forming a word line of the memory cell, and numerals 5 and 6 are source/drain regions formed on left and right sides under the gate electrode 4. Numeral 7 is a side wall serving as an insulating film to cover the gate electrode 4, and numeral 8 is a trench formed in the source/drain regions 5, 6 to be deeper than the source/drain regions 5, 6.

Numeral 10 is a silicon carbide plug (SiC) in which the source and drain are arranged not to short each other. Numeral 11 is a silicon carbide plug (SiC) having one end connected to the source region 5 and another end connected to the bit line 203 of the memory cell indicated by the broken line in the FIG. 1 Numerals 12 and 13 are nitride and oxide films (SiON films), and numeral 14 is a silicon nitride film, each film forming an interlayer insulating film. Numeral 15 is a trench opened in the interlayer insulating film. Numeral 17 is a storage node contact formed in the trench and forming a second wiring layer. Numeral 19 is a storage node, numeral 20 is a capacitor insulating film composed of a titanium nitride film and a tantalum oxide film, and numeral 21 is a cell plate. A capacitor 22 is formed by the storage node 19, the capacitor insulating film 20, and the cell plate 21.

This semiconductor device is a n-type MOS transistor, in which the p-type semiconductor substrate 1 includes boron of about $1 \times 10^{15}/cm^3$, for example, and the gate electrode 4 has a gate length L=0.1 to 0.2 μm and includes n-type impurities such as phosphorus or arsenic. The source/drain regions 5 and 6 are also formed by injecting n-type impurity ion such as phosphorus or arsenic, and their concentration of impurities is about $1 \times 10^{17}$ to $1 \times 10^{18}/cm^3$. The silicon carbide plugs 10 and 11 are 6H—SiC or 4H—SiC, and include nitrogen of about $1 \times 10^{18}$/cm3 to $1 \times 10^{20}/cm^3$ as n-type impurities. Further, an energy band gap of 6H—SiC is 2.86 eV, and that of 4H—SiC is 3.25 eV. An energy band gap of silicon is 1.12 eV. Although silicon carbide (SiC) is taken as an example herein, any other material is preferable which has an energy hand gap larger than silicon.

A depth of the trench 8 is about 0.01 μm to 0.1 μm, and the trench 8 is preferably formed in such a manner to go through the source/drain region 5.

The capacitor insulating film 20 is composed of a titanium nitride film of about 100 Å to 500 Å and a tantalum oxide film of about 50 Å to 100 Å formed on the surface thereof. Capacity is increased by the tantalum oxide film of high dielectric constant, and tantalum atom (Ta) is prevented by the titanium nitride film from being diffused from the storage node 19 to other parts. The cell plate 21 is formed of polysilicon which includes phosphorus of about $1 \times 10^{20}/cm^3$. Storage node 19 is formed of polysilicon which includes n-type impurities of $1 \times 10^{20}/cm^3$ to $1 \times 10^{21}/cm^3$ such as phosphorus or arsenic. It may also be preferable to employ a fluoride and oxide film (SiOF) instead of the nitride and oxide films 12 and 13. As the dielectric constant of the fluoride and oxide film is small as compared with the silicon oxide film, interlayer parasitic capacity is reduced, whereby it is possible to improve the operating speed of the transistor.

In each active region surrounded by the isolating oxide film 2, two cell transistors are formed, and a gate electrode of a transistor used in the memory cell of another address is formed on the isolating oxide film 2.

Although a STI (Shallow Trench Isolation) is illustrated herein as the isolating oxide film, any other isolation oxide film can be employed such as LOCOS (Local Oxidation of Silicon). In addition, a channel layer or a channel cut layer can be formed in the semiconductor substrate 1, when required.

In the refresh operation, by applying a voltage simultaneously to one word line selected among the word lines connected to the gate electrode 4 and to a bit line selected among the bit lines connected to the source/drain region 5 through the silicon carbide plug 11, one of the transistors in the memory cell is turned on. By amplifying a small current flowing at this moment using the sense amplifier, an information written in the capacitor 22 is read out. Likewise at the time of writing an information, by applying a voltage to the gate electrode 4 and to the source/drain region 5, the transistor is turned on and a current flows, whereby information is written in the capacitor 22 through the drain 6, the silicon carbide plug 10, and the storage node contact 17. The information to be written in the capacitor 22 is decided by the voltage applied to the source/drain region 5 (bit line). For example, a source voltage $V_{cc}$=2V, a substrate bias voltage $V_{BB}$=1V, a drain voltage $V_{DD}$=2V, and a gate voltage is increased to about $V_G$=4V and applied.

In the semiconductor device according to the first preferred embodiment of the present invention, since the silicon carbide plug 10 connecting the source/drain region 6 to the storage node contact 17 is formed by 4H—SiC or 6H—SiC having an energy band gap larger than silicon, it is possible to restrain both current generated in the process of Shockley-Read-Hall (SRH) and tunnel current between bands, whereby the junction leakage current in the vicinity of the source/drain regions can be reduced. As a result, the refresh pause time is prolonged, that is, characteristics of refresh are improved and reliability of the semiconductor device is also improved.

Further, since the trench 8 is formed, the main surface of the source/drain region 6 is removed at the time of forming the trench 8, and the surface area of the source/drain region 6 is increased as compared with that before forming the trench 8. Accordingly, a stress per unit area concentrated on the source/drain region 6 in the vicinity of ends of the isolating oxide film 2 or on the p-type semiconductor substrate 1 is reduced, and thereby any occurrence of minute defects is restrained. As a result, any leakage current caused by minute defects due to stress is reduced, and the refresh pause time is prolonged, in other words, characteristics of refresh can be improved. Furthermore, since the silicon carbide plug 10 is so arranged as to go through the source/drain region 6, pollution on the surface of the source/drain region 6 is removed, whereby any defective junction is restrained. In addition, as the energy band gap of the silicon carbide plug 10 is large, the leakage current can be restrained all the more, and the refresh pause time can be prolonged.

If the fluoride and oxide film is employed, for example, as an interlayer insulating film and the dielectric constant of this fluoride and oxide film is low as compared with the silicon oxide film, interlayer parasitic capacity is reduced, whereby operating speed of the transistor can be improved.

FIGS. 2 to 9 are sectional views showing sequential steps of a manufacturing method of the semiconductor device shown in FIG. 1 according to a first preferred embodiment of the present invention. Referring to FIGS. 2 to 9, reference numeral 9 is a silicon carbide layer (SiC), numeral 16 is a n-type polysilicon, and numeral 18 is a silicon oxide film.

Figure 2:
FIGS. 2 to 9 are sectional views showing sequential steps of a manufacturing method of the semiconductor device shown in FIG. 1 according to the present invention.

First, as shown in FIG. 2, after forming a shallow trench in the isolated region of the semiconductor substrate 1 and filling up the trench with an oxide film, the surface is flattened by CMP (Chemical Mechanical Polishing) and the isolating oxide film 2 is formed. A STI (Shallow Trench Isolation) is herein illustrated as the isolating oxide film 2. Although the surface of the STI is coincident to the height of the surface of the semiconductor substrate 1 in FIG. 2, the surface is not always coincident thereto. Any other shape of an isolating oxide film such as LOCOS (Local Oxidation of Silicon) is also satisfiable.

Figure 3:
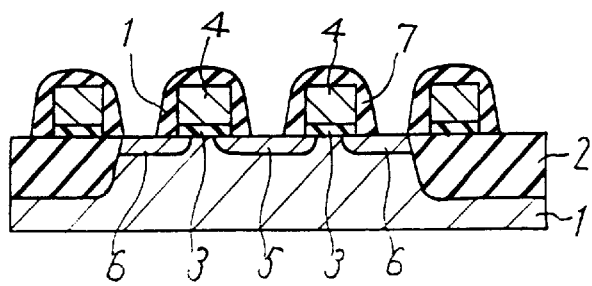

Then, after performing channel injection or channel cut injection with impurities such as boron or boron fluoride when required (not illustrated), the gate oxide film 3 is formed by thermal oxidation as shown in FIG. 3. Then, the gate electrode 4 composed of a polysilicon film including n-type impurities such as phosphorus or arsenic is formed.

Then, after forming the source/drain regions 5 and 6 by ion implantation of n-type impurities such as phosphorus or arsenic, a silicon oxide film is formed on the entire surface, which is then etched back to form the side wall 7. At this time, the side wall 7 may be formed either of silicon nitride film or TEOS (Tetraethyl Orthosilicate).

Figure 4:
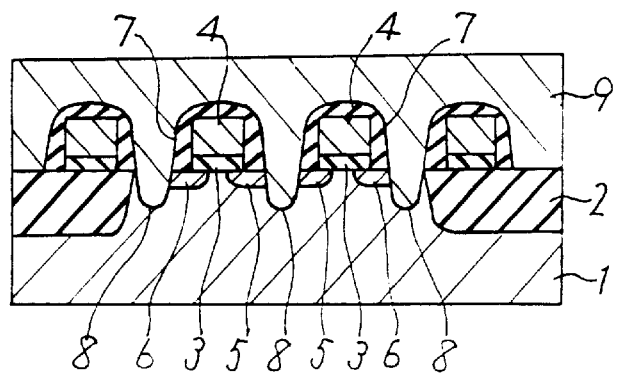

As shown in FIG. 4, by etching the source/drain regions 5, 6 and the semiconductor substrate 1 using the isolating oxide film 2 and the side wall 7 as masks, a trench 8 having a depth of 0.01 μm to 0.1 μm from the surface of the semiconductor substrate 1 and piercing through the source/drain regions 5 and 6 in a self-aligned manner is formed. Then, the silicon carbide layer (SiC) 9 of which surface includes nitrogen serving as n-type impurities is subject to an epitaxial growth.

Figure 5:
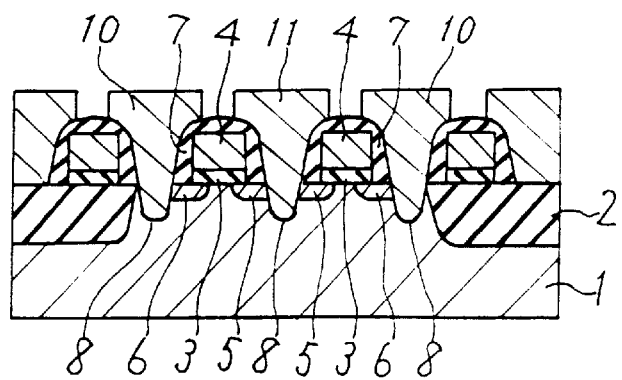

Then, masking a part except the gate electrode 4, an etching is performed as shown in FIG. 5, whereby the silicon carbide plugs 10 and 11 including nitrogen in the amount of about $1 \times 10^{18}$ to $1 \times 10^{20}/cm^3$ are formed.

Then, after depositing a nitride and oxide film (SiON) 12 on the entire surface, a mask patterning is performed, whereby a trench reaching the silicon carbide plug 11 is formed (not illustrated). Thereafter, by depositing a tungsten layer, flattening the surface with CMP, mask patterning and etching, the bit line is formed (not illustrated).

Figure 6:
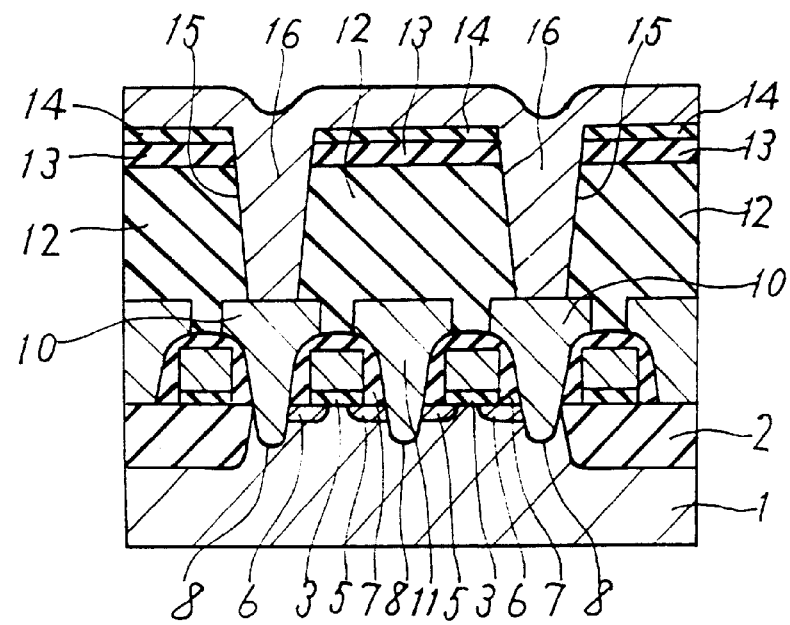

Further, as shown in FIG. 6, after depositing the nitride and oxide film 13 and the silicon oxide film 14 on the entire surface, a mask patterning and an etching are performed, whereby the trench 15 of which depth from the surface of the nitride film 14 is about 0.1 μm to 0.3 μm is formed.

Figure 7:
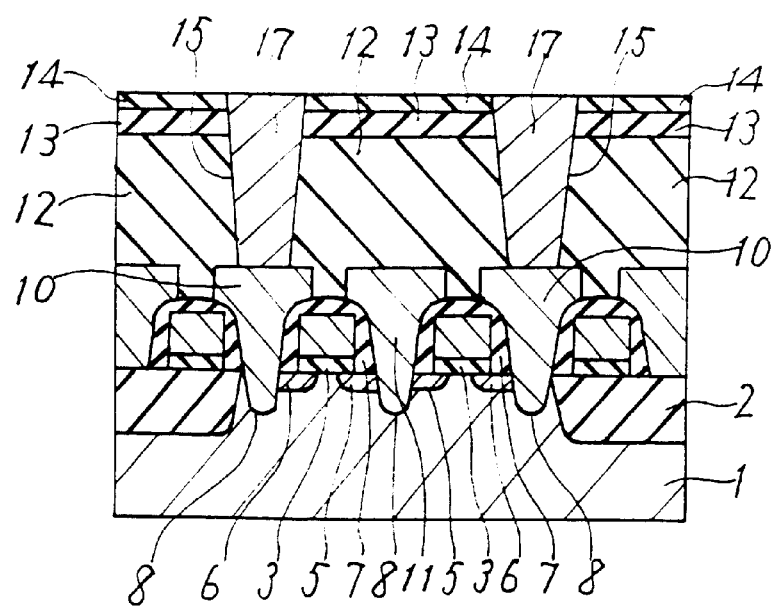

Then, as shown in FIG. 7, after forming the n-type polysilicon film 16 including n-type impurities such as phosphorus or arsenic in an amount of about $1 \times 10^{20}$ to $1 \times 10^{21}/cm^3$ on the entire surface and filling up the trench 15, a flattening is performed by CMP until reaching the same height as the surface of the silicon nitride film 14, and the storage node contact 17 is formed.

Figure 8:
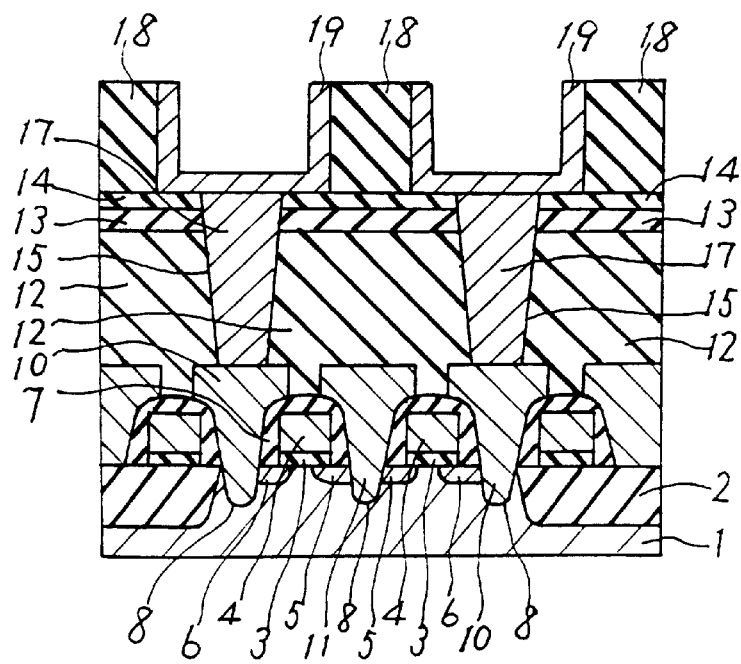

Then, as shown in FIG. 8, after forming the silicon oxide film 18 on the entire surface except the upper region of the storage node contact 17 where the storage node 19 is formed, a n-type polysilicon film including phosphorus or arsenic which is the same impurity as the storage node contact 17 is deposited. Although a cylindrical storage node is illustrated in the drawing, any other shape such as a fin type storage node may be formed, and subsequently a treatment such as roughening of the surface is performed, when required.

Figure 9:
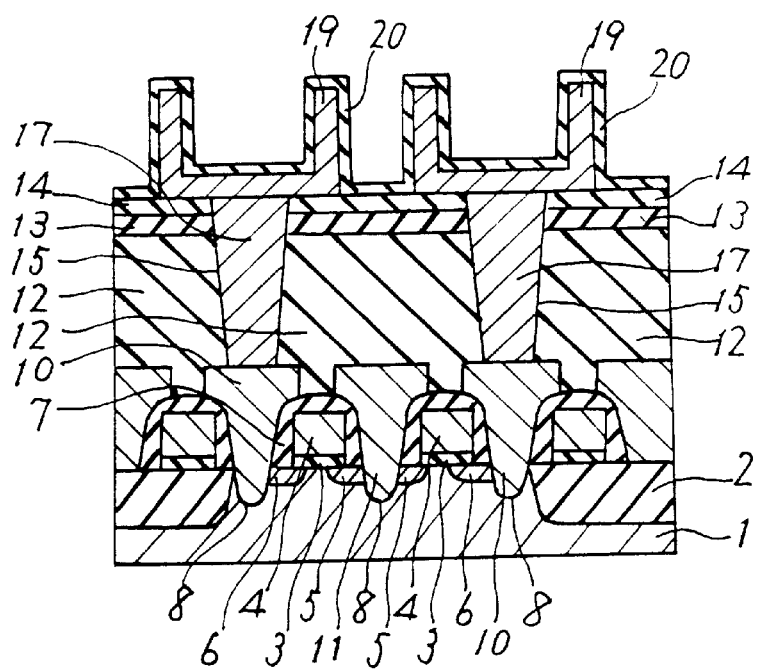

After removing the silicon oxide film 18, as shown in FIG. 9, a tantalum nitride film (TiN) is formed on the entire surface and a tantalum oxide film ($Ta_2O_5$) of about 50 Å to 100 Å is further formed thereon, whereby the capacitor insulating film 20 is formed. Thereafter, a polysilicon including phosphorus of about $1 \times 10^{21}/cm^3$ is deposited on the entire surface of the polysilicon, and a patterning is performed, whereby the cell plate 21 is formed. The capacitor insulating film 20 and the cell plate 21 may be either formed in such a manner as to coat the entire surface of the memory cell region or may be formed in such a manner as to be divided into plural parts. In this manner, the semiconductor device shown in FIG. 1 is formed.

In a case of forming the memory cell and the peripheral circuit in one substrate, the mentioned arrangement is performed at the time of forming the capacitor, after masking to expose only the memory cell region.

In the manufacturing method of the semiconductor device according to the first preferred embodiment of the present invention, since the trench 8 is formed in a self-aligned manner using the side wall 7 and the isolating oxide film 2 as masks and the silicon carbide plug 10 is formed, pollution on the surface of the source/drain regions 6 is removed by a simple process, and any stress concentrated on the source/drain region 6 in the vicinity of the end of the isolating oxide film and on the p-type semiconductor substrate 1 is reduced, and any occurrence of minute defects are restrained. As a result, any leakage current caused by minute defects due to stress is reduced, and the refresh pause time is prolonged, in other words, characteristics of refresh can be improved.

Further, since the plug 10 connecting the source/drain region 6 to the storage node contact 17 is formed by 4H—SiC or 6H—SiC having an energy band gap larger than silicon, it is possible to restrain both current generated in the process of Shockley-Read-Hall (SRH) and tunnel current between bands, and the area of n-p junction formed by the source/drain region 6 and the p-type semiconductor substrate 1 is reduced, whereby a defective junction is restrained, and junction leakage current in the vicinity of the source/drain region 6 can be reduced.

A semiconductor device according to a second preferred embodiment of the present invention and a manufacturing method thereof are hereinafter described.

FIGS. 10 to 15 are sectional views showing the semiconductor device according to the second preferred embodiment of the present invention.

Referring to FIGS. 10 to 15, reference numerals 23 and 24 are polysilicon plugs, and numeral 25 is a polysilicon film. In FIGS. 10 to 15, like reference numerals are designated to the same parts as or equivalents in the foregoing first preferred embodiment.

Figure 10:
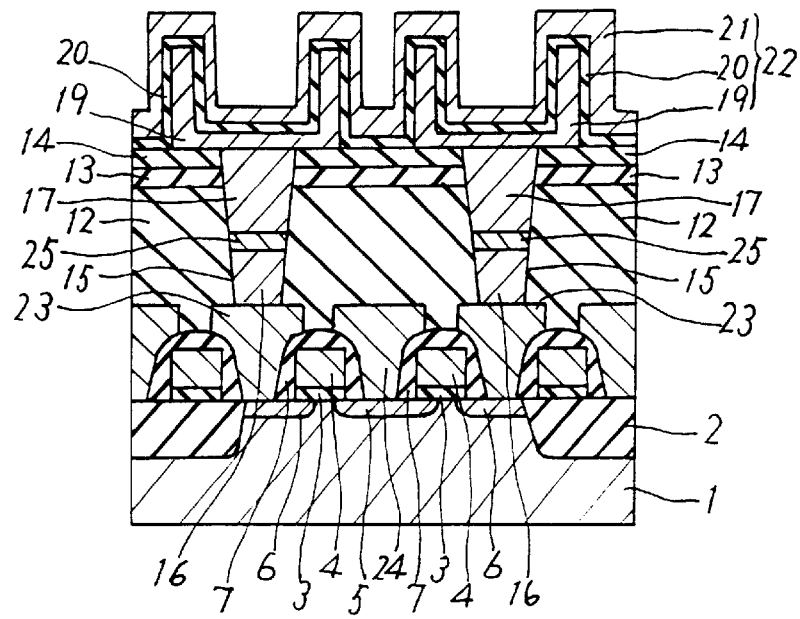
FIGS. 10 to 15 are sectional views showing a semiconductor device according to a second preferred embodiment of the present invention.

First, referring to FIG. 10, a thickness of the polysilicon film 25 is about 1 nm, and in a case of including n-type impurities such as phosphorus or arsenic, a concentration of the impurities is about $1 \times 10^{16}$ to $1 \times 10^{18}/cm^3$, but it is not always necessary to include the impurities. What is different about this second preferred embodiment from the foregoing first preferred embodiment is that the trench 8 is not formed.

However, the polysilicon film 25 is so thin that a tunnel current flows by applying a normal write or read voltage.

Figure 11:
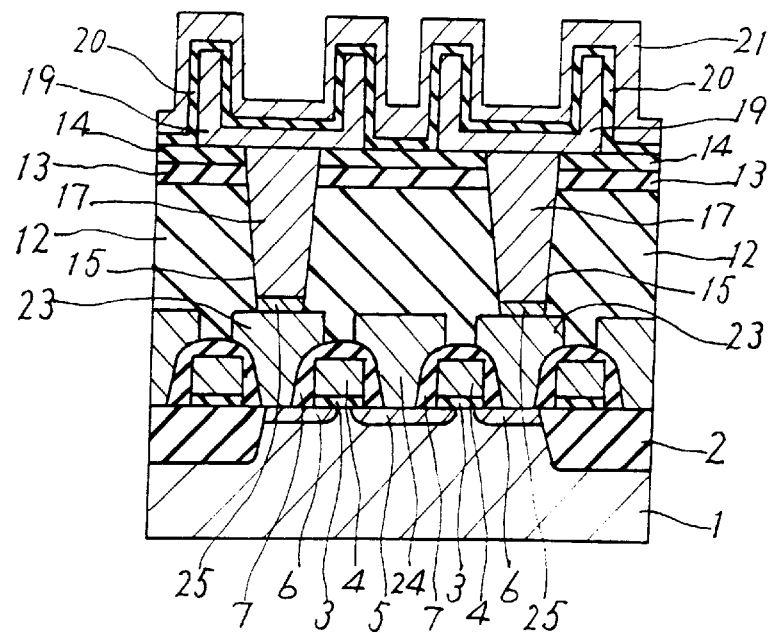
Figure 12:
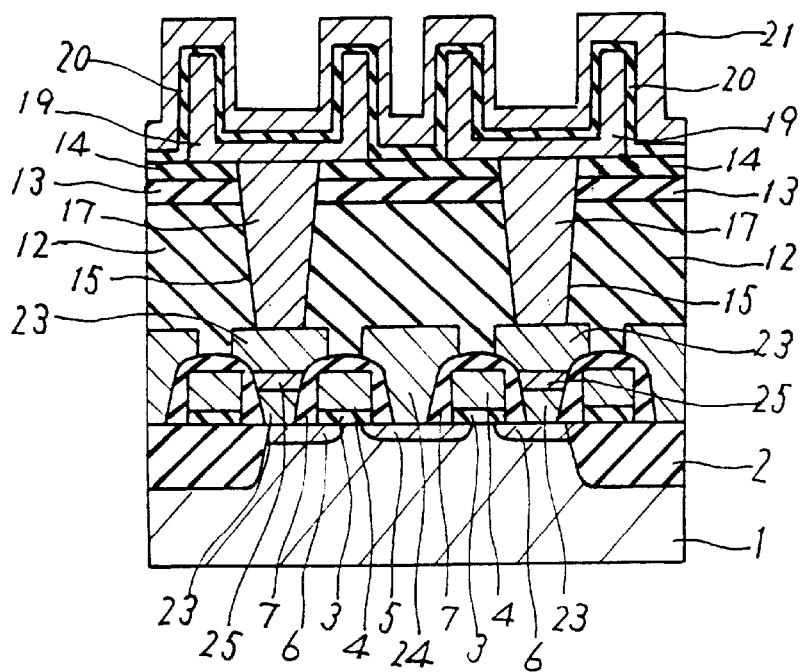
Figure 13:
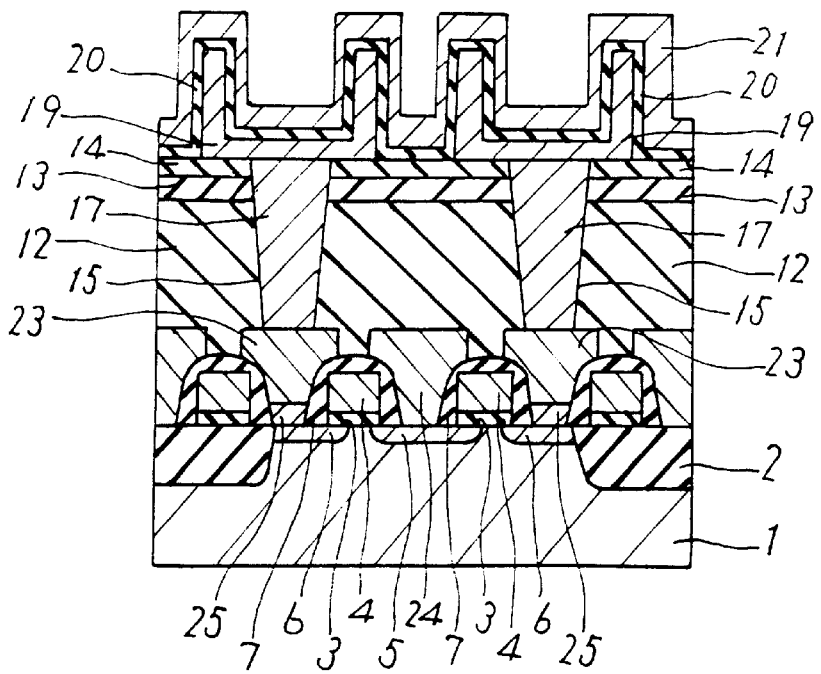

As shown in FIG. 11, the polysilicon film 25 may be formed on the boundary surface between the storage node contact 17 and the polysilicon plug 23. It is also possible for the polysilicon film 25 to be formed in an internal part of the polysilicon plug 23 as shown in FIG. 12, or on a boundary surface between the polysilicon plug 23 and the source/drain region 6 as shown in FIG. 13. However, as a contact resistance dependent on a surface condition of the source/drain region 6 is generated in the junction part between the polysilicon plug 23 and the source/drain region 6, the resistance is further increased and a data write speed is lowered if forming the polysilicon film 25 on this part. Therefore, it is preferred that the polysilicon film 25 is formed in such a manner as to be separate from the junction surface between the polysilicon plug 23 and the source/drain region 6.

In the semiconductor device according to the second preferred embodiment of the present invention, since the polysilicon film 25 is formed having a small impurity concentration, as compared with the storage contact 17 which is formed of polysilicon including phosphorus or arsenic of about $1 \times 10^{20}$ to $1 \times 10^{21}/cm^3$ as n-type impurities, and with the polysilicon plug 23 which includes n-type impurities such as phosphorus or arsenic of about $1 \times 10^{18}$ to $1 \times 10^{21}/cm^3$, resistance of the polysilicon film 25 is increased. As a current hardly flows without application of a voltage in the polysilicon film 25, leakage current is restrained from flowing between the storage node 19 and the source/drain region 6, and a refresh pause time can be prolonged.

Further, when forming a silicon carbide film which includes n-type impurities such as nitrogen of about $1 \times 10^{18}$ to $1 \times 10^{20}/cm^3$ instead of the polysilicon film 25, as the energy band gap is increased, leakage current can be reduced, and the refresh pause time can be prolonged.

Figure 14:
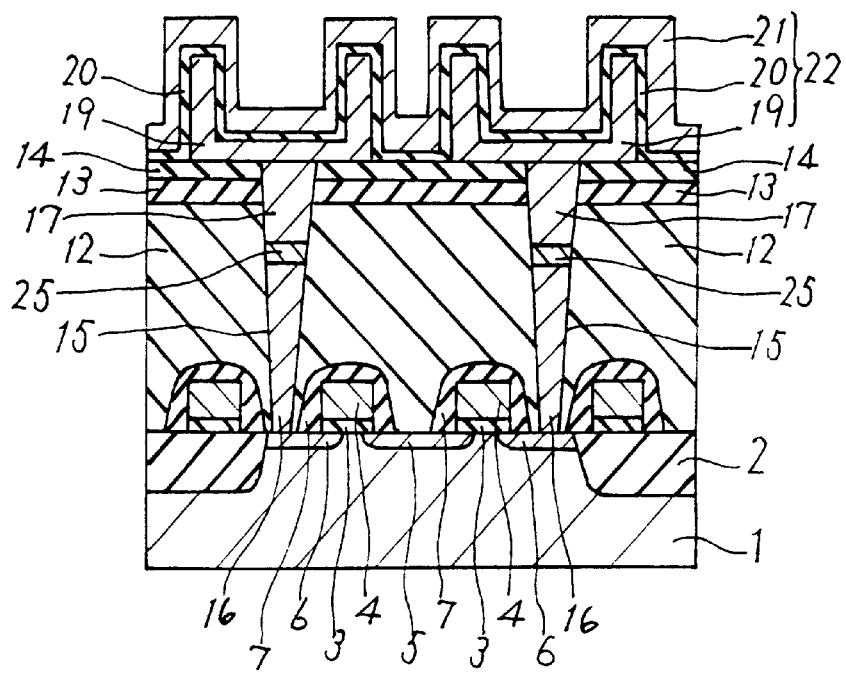
Figure 15:
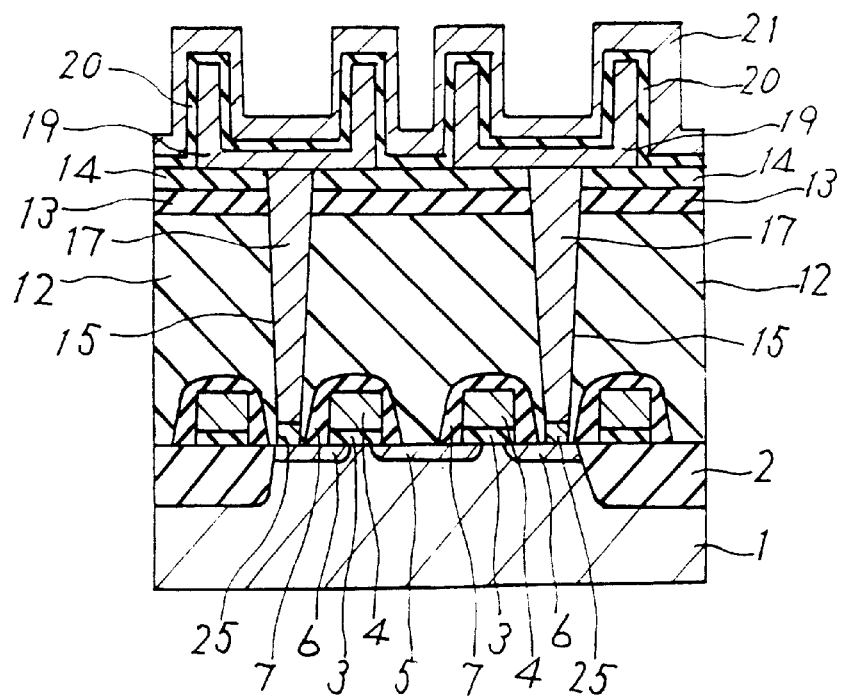

When the polysilicon plug 23 is not formed, the polysilicon film 25 can be preferably formed on the internal part of the storage node contact 17 as shown in FIG. 14 or on the boundary surface between the storage node contact 17 and the source/drain region 6 as shown in FIG. 15. However, a contact resistance dependent on the surface condition of the source/drain region 6 is generated at the junction part between the storage node contact 17 and the source/drain region 6. Accordingly, if forming the polysilicon film 25 on such a part, the resistance is further increased and the data write speed is lowered. Therefore, it is preferred that the polysilicon film 25 is formed in such a manner to be separate from the junction part between the storage node contact 17 and the source/drain region 6 as shown in FIG. 14.

Figure 16:
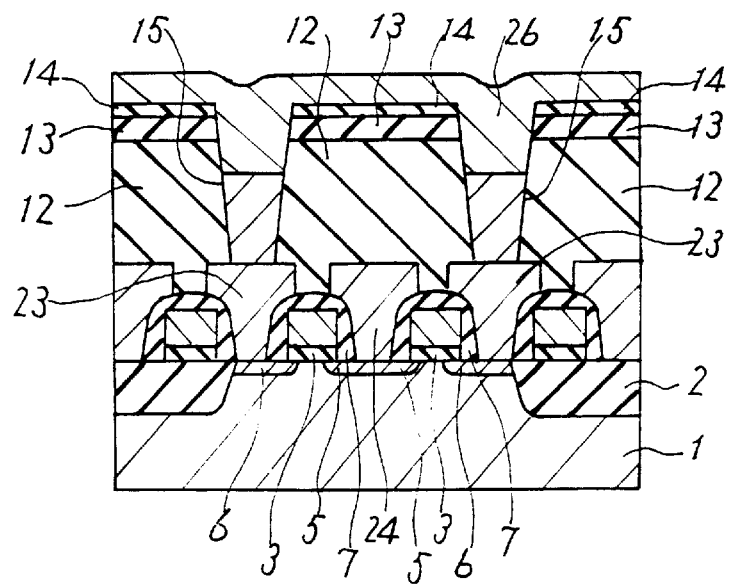
FIG. 16 is a sectional view showing a step of a manufacturing method of the semiconductor device shown in FIG. 10.
Figure 17:
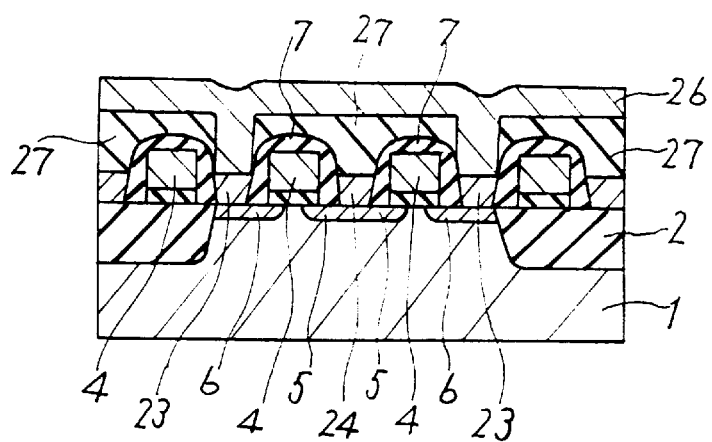
FIG. 17 is a sectional view showing a step of a manufacturing method of the semiconductor device shown in FIG. 12.
Figure 18:
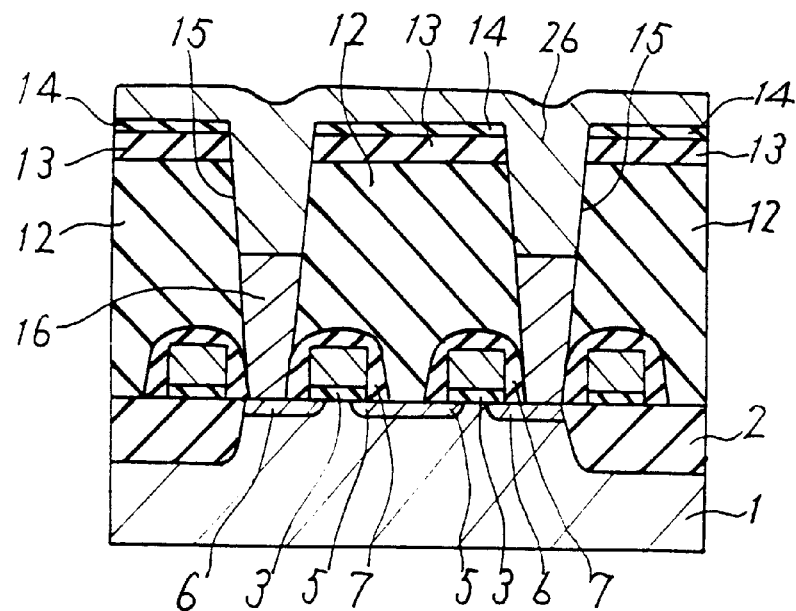
FIG. 18 is a sectional view showing a step of a manufacturing method of the semiconductor device shown in FIG. 14.

FIGS. 16 to 18 are sectional views each showing a step of a manufacturing method of the semiconductor device according to the second preferred embodiment of the present invention. In FIGS. 16 to 18, reference numeral 26 is a polysilicon film, and numeral 27 is a silicon film.

First, a manufacturing method of the semiconductor device shown in FIG. 10 is hereinafter described.

After forming the isolating oxide film 2, the gate oxide film 3, the gate electrode 4, the source/drain regions 5 and 6, and the side wall 7 on the semiconductor substrate 1 in the same manner as in the foregoing first preferred embodiment, the polysilicon plugs 23 and 24 are formed in the same manner as formation of the silicon plugs 10, 11 in the first preferred embodiment, and the nitride and oxide films 12 and 13, the silicon nitride film 14, and the trench 15 are formed.

Then, the n-type polysilicon film 16 including n-type impurities such as phosphorus or arsenic of about $1 \times 10^{20}$ to $1 \times 10^{21}/cm^3$ is formed on the entire surface and etched back, whereby the trench 15 is filled up to a halfway thereof. Thereafter, as shown in FIG. 16, a polysilicon film 26 which includes n-type impurities such as phosphorus or arsenic of about $1 \times 10^{16}$ to $1 \times 10^{18}/cm^3$ or does not include any n-type impurity is formed on the entire surface and etched back, whereby the polysilicon film 25 of about 1 nm in thickness is formed.

Then, after forming a polysilicon film 17 on the entire surface so as to fill up the trench 15 completely, the surface is flattened by CMP in the same manner as in the first preferred embodiment until reaching the same height as the surface of the silicon nitride film 14, and the capacitor 22 is formed further thereon.

After forming the trench 15, when the polysilicon film 26 is formed before forming the n-type polysilicon film 16, a semiconductor, in which the polysilicon film 25 is formed on the boundary surface between the storage node contact 17 and the polysilicon plug 23 as shown in FIG. 11, is obtained.

A manufacturing method of the semiconductor device shown in FIG. 12 is hereinafter described.

In the same manner as in the first preferred embodiment, the isolating oxide film 2, the gate oxide film 3, the gate electrode 4, the source/drain regions 5 and 6, and the side wall 7 are formed on the semiconductor substrate 1.

Then, the polysilicon film including n-type impurities such as phosphorus or arsenic of about $1\times10^{18}$ to $1\times10^{20}/cm^3$ is formed on the entire surface and etched back, whereby a part of the polysilicon plugs 23 and 24 is formed on the surface of the source/drain regions 5 and 6. Thereafter, as shown in FIG. 17, a masking is performed with the silicon nitride film 27 so as to expose only the surface of the source/drain region 6. Then, the polysilicon film 26 which includes n-type impurities such as phosphorus or arsenic of about $1\times10^{16}$ to $1\times10^{18}/cm^3$ or does not include any n-type impurity is formed on the entire surface and etched back, whereby the polysilicon film 25 of about 1 nm in thickness is formed as shown in FIG. 12. The silicon nitride film 27 is then removed.

In the same manner as in the formation of the silicon carbide plugs 10, 11 in the first preferred embodiment, the polysilicon plugs 23 and 24 are formed, and the nitride and oxide films 12, 13, the silicon nitride film 14, the trench 15, the storage node contact 17, and the capacitor 22 are also formed.

After forming the side wall 7, when the polysilicon film 26 is formed before forming the polysilicon plugs 23 and 24, a semiconductor, in which the polysilicon film 25 is formed on the boundary surface between the source/drain region 6 and the polysilicon plug 23 as shown in FIG. 13, is obtained.

A manufacturing method of the semiconductor device shown in FIG. 14 is hereinafter described.

After forming the isolating oxide film 2, the gate oxide film 3, the gate electrode 4, the source/drain regions 5 and 6, the side wall 7, the nitride and oxide films 12 and 13, and the silicon nitride film 14 on the semiconductor substrate 1, in the same manner as in the first preferred embodiment, the trench 15 reaching the source/drain region 6 is formed.

Then, as shown in FIG. 18, the n-type polysilicon film 16 including n-type impurities such as phosphorus or arsenic of about $1\times10^{20}$ to $1\times10^{21}/cm^3$ is formed on the entire surface and etched back, whereby the trench 15 is filled up to a halfway thereof. Thereafter, the polysilicon film 26 which includes n-type impurities such as phosphorus or arsenic of about $1\times10^{16}$ to $1\times10^{18}/cm^3$ or does not include any n-type impurity is formed on the entire surface and etched back, whereby the polysilicon film 25 of about 1 nm in thickness is formed as shown in FIG. 14.

Then, after forming the polysilicon film 16 on the entire surface to fill up the trench 15 completely, the surface is flattened by CMP in the same manner as in the first preferred embodiment until reaching the same height as the surface of the silicon nitride film 14, and the capacitor 22 is formed further thereon.

After forming the trench 15, when the polysilicon film 26 is formed before forming the n-type polysilicon film 16, a semiconductor, in which the polysilicon film 25 is formed on the boundary surface between the storage node contact 17 and the polysilicon plug 23 as shown in FIG. 15, is obtained.

In the manufacturing method of the semiconductor device according to the second preferred embodiment of the present invention, since the polysilicon film 25 is formed having a small impurity concentration, as compared with the storage contact 17 which is formed of polysilicon including phosphorus or arsenic of about $1\times10^{20}$ to $1\times10^{21}/cm^3$ as n-type impurities, and with the polysilicon plug 23 which includes n-type impurities such as phosphorus or arsenic of about $1\times10^{18}$ to $1\times10^{21}/cm^3$, resistance of the polysilicon film 25 is increased. As a result, a manufacturing method of the semiconductor device in which the leakage current is restrained from flowing between the storage node 19 and the source/drain region 6, and the refresh pause time can be prolonged, is achieved.

Further, when employing a silicon oxide film which is an insulating material instead of the polysilicon film 25, the resistance is increased, and the same advantage of restraining leakage current can be achieved.

Further, it is also possible to form a silicon carbide film which includes n-type impurities such as nitrogen of about $1\times10^{18}$ to $1\times10^{21}/cm^3$ in the same manner as in the formation of the polysilicon film 25, and when forming such a silicon carbide film, as the energy band gap is increased, it becomes possible to achieve a manufacturing method of the semiconductor device in which leakage current can be reduced and a refresh pause time is long.

A semiconductor device according to a third preferred embodiment of the present invention and a manufacturing method thereof are hereinafter described.

Figure 19:
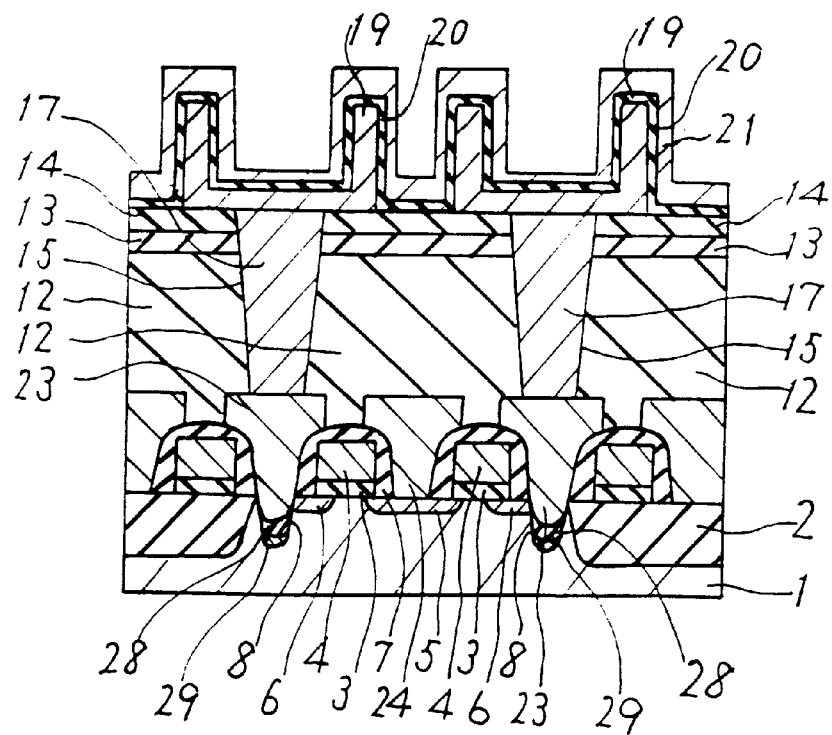
FIG. 19 is a sectional view showing a semiconductor device according to a third preferred embodiment of the present invention.

FIG. 19 is a sectional view showing the semiconductor device according to the third preferred embodiment of the present invention. Referring to FIG. 19, reference numeral 28 is a silicon oxide film, and numeral 29 is a p-type impurity layer. In FIG. 19, like reference numerals are designated to the same parts as or equivalents in the first preferred embodiment.

In this semiconductor device, the trench 8 is formed occupying a part of the source/drain regions 5 and 6, and the p-type impurity layer 29 including boron, etc. of about $1\times10^{20}$ to $1\times10^{21}/cm^3$ is formed in the p-type semiconductor substrate 1 under the trench 8. The silicon oxide film 28 of 1 nm to 10 nm in thickness is formed between the polysilicon plugs 23, 24 and the p-type semiconductor substrate 1, and therefore the p-type semiconductor substrate 1 is not in direct contact with the polysilicon plugs 23, 24.

In the semiconductor device according to the third preferred embodiment of the present invention, a part of the source/drain region 6 is replaced with the polysilicon plugs 23, the p-type semiconductor substrate 1 is not in direct contact with the polysilicon plugs 23 because the silicon oxide film 28 is interposed therebetween, the p-n junction area between the source/drain region 6 and the p-type semiconductor substrate 1 is reduced thereby reducing a defective junction, and leakage current can be restrained, and thus, it becomes possible to achieve a DRAM cell of a long refresh pause time.

Further, any pollution on the surface of the source/drain regions is 6 removed as a result of forming the trench 8, a defective junction is restrained, and any stress concentrated on the source/drain regions in the vicinity of ends of the isolating oxide film 2 and on the p-type semiconductor substrate 1 is reduced, and therefore leakage current can be reduced and the refresh pause time can be prolonged, eventually resulting in an improvement in reliability of the semiconductor device.

Further, since the trench 8 is formed also in the part where the source/drain region 5 is formed in the same manner as the source/drain region 6, not only is the p-n junction area between the p-type semiconductor substrate 1 and the source/drain region 5 reduced, thereby reducing a defective junction, but also any pollution on the surface of the source/drain regions 5, 6 is removed, and advantages are achieved such that a defective junction is restrained, leakage current can be reduced, and drive performance is improved.

In a case of placing a greater importance on an improvement of punch-through resistance, it is also possible to form the trench 8 only on the part of the source/drain region 6 (not illustrated).

Figure 20:
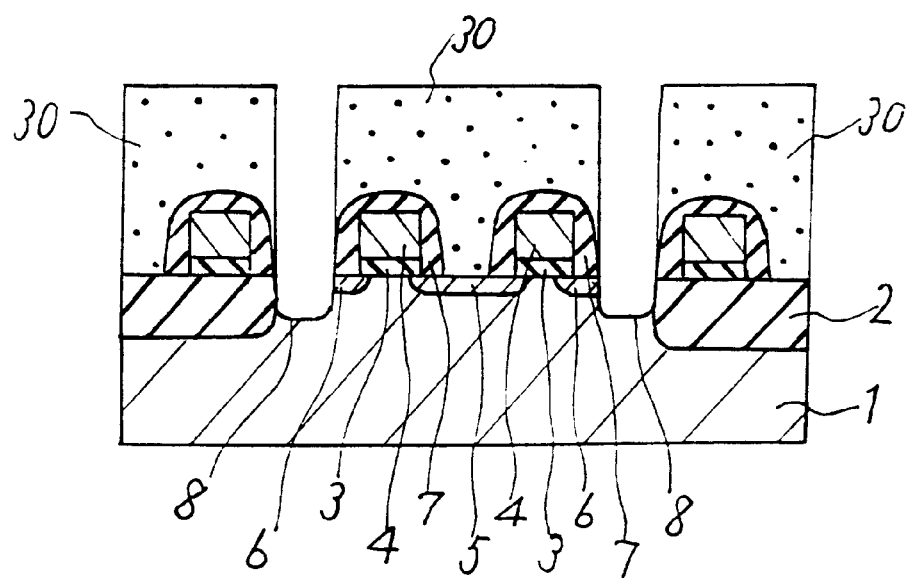
FIGS. 20, 22 and 23 are sectional views showing sequential steps of a manufacturing method of the semiconductor device shown in FIG. 19 according to the present invention.
Figure 21:
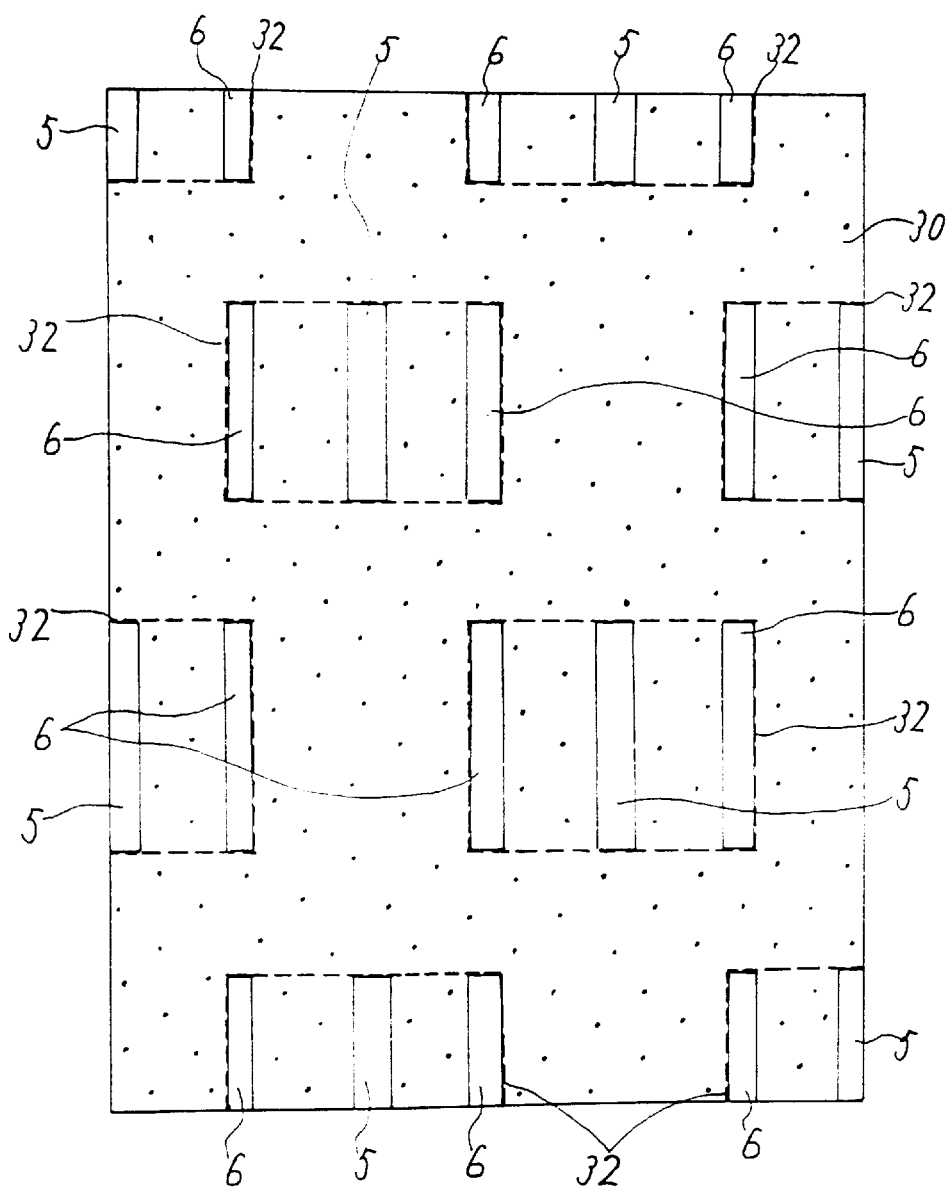
FIGS. 21 and 24 are plan views showing a step of a manufacturing method of the semiconductor device shown in FIG. 19.
Figure 22:
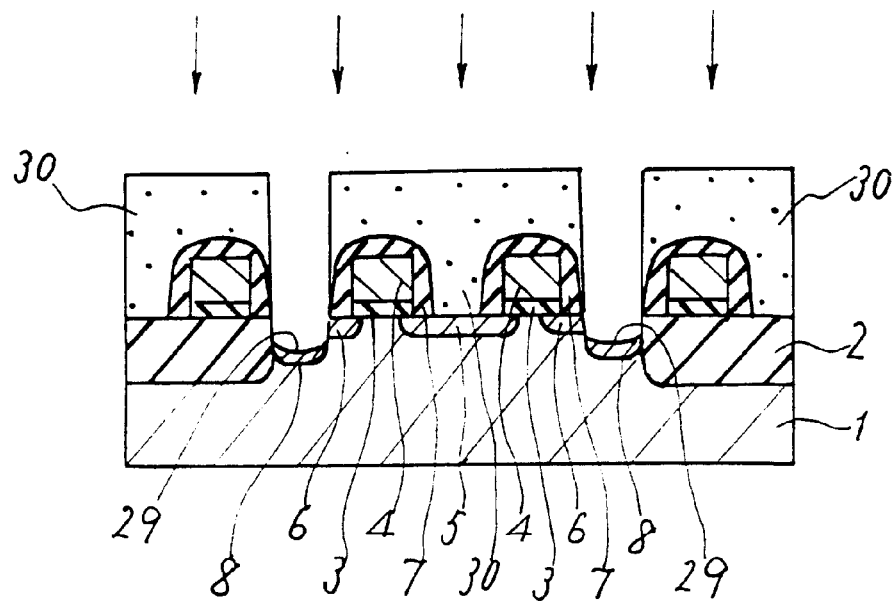
Figure 23:
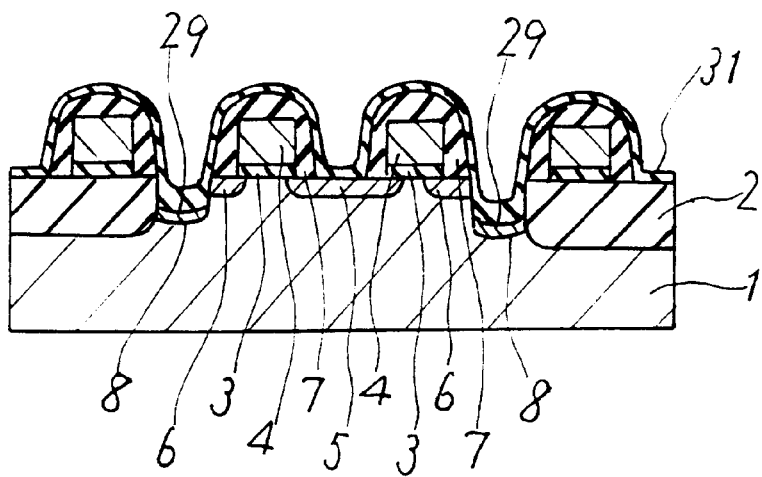
Figure 24:
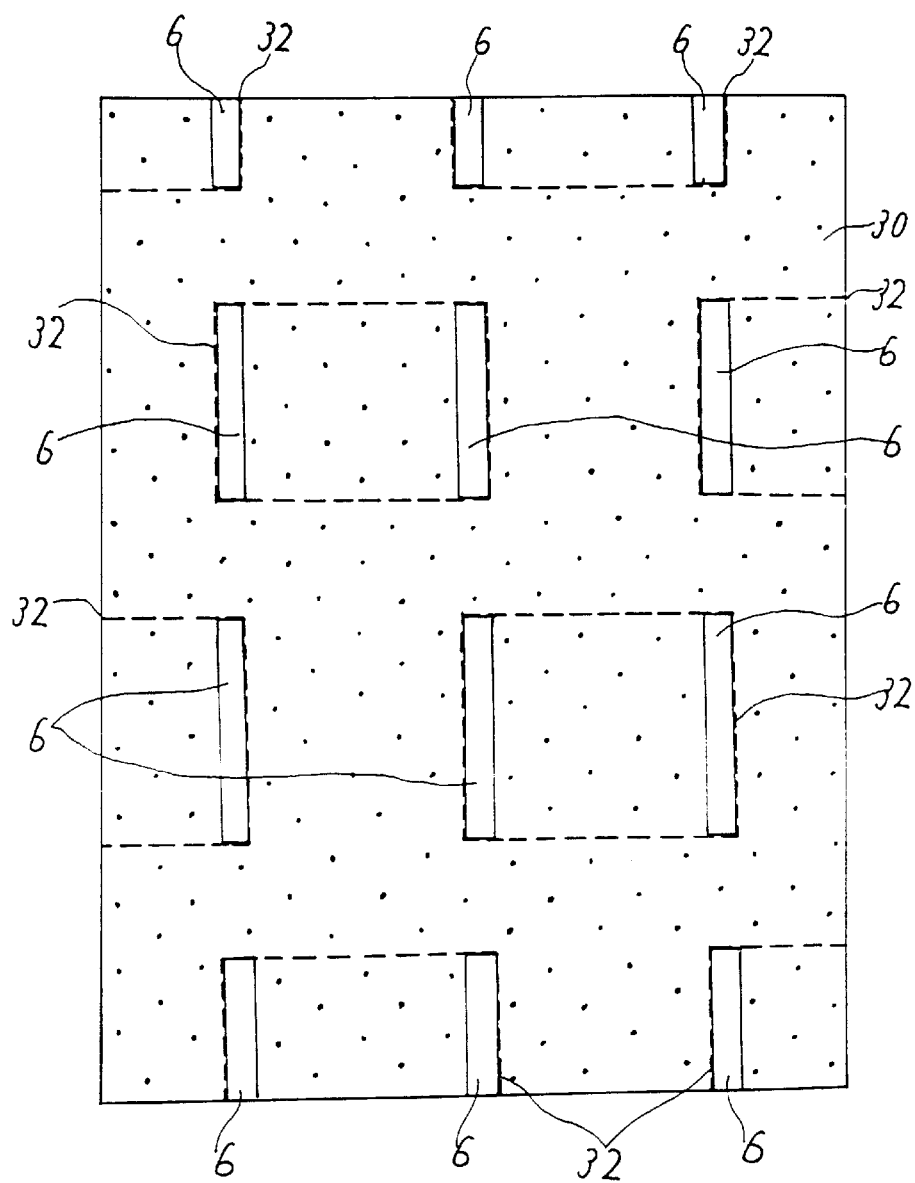

FIGS. 20, 22 and 23 are sectional views showing sequential steps of a manufacturing method of the semiconductor device shown in FIG. 19, and FIGS. 21 and 24 are plan views showing a step of the manufacturing method of the semiconductor device shown in FIG. 19. Referring to FIGS. 20 to 24, reference numeral 30 is a resist, numeral 31 is a silicon oxide film, and broken lines 32 indicate a boundary portion between an active region and the element isolating oxide film 2.

First, after forming the isolating oxide film 2, the gate oxide film 3, the gate electrode 4, the source/drain regions 5 and 6, and the side wall 7 on the semiconductor substrate 1, in the same manner as in the first preferred embodiment, the resist 30 is formed to coat the entire surface, except the surface of the source/drain region 6. FIG. 21 is a plan view showing that the mentioned steps have been completed. Then, using the resist 30 and the side wall 7 as masks, an aeolotropic etching is performed, whereby the trench 8 piercing through the source/drain regions 5 and 6 is formed.

Then, as shown in FIG. 22, using the same mask as that for forming the trench 8, the p-type impurity layer 29 including boron of about $1\times10^{20}$ to $1\times10^{21}/cm^3$ is formed on the surface of the p-type semiconductor substrate 1 where the trench 8 is formed. Although the resist 30 is employed as the mask, it is also preferable to employ a silicon nitride film as the mask.

After removing the resist 30, a silicon oxide film 31 is formed by thermal oxidation as shown in FIG. 23.

By this oxidation, the surface of the source/drain region 5, the surface of the source/drain region 6 exposed on the inner wall part of the trench 8, and the surface of the p-type semiconductor substrate 1 are coated with the silicon oxide film 31. Since the p-type impurity layer 29 including boron of a high concentration is formed on the surface of the p-type semiconductor substrate 1 on the bottom surface of the trench 8, an accelerated oxidation takes place. Since the source/drain region 5 is also a high concentration layer of n-type impurities, the same accelerated oxidation takes place on the upper surface thereof. However, by adjusting the concentration of the p-type impurity layer 29 and that of the source/drain regions 5 and 6, it is possible to form the silicon oxide film 31 so that the thickness of the silicon oxide film 31 formed on the bottom surface of the trench 8 may be larger than the thickness of the silicon oxide film 31 formed on the upper side of the source/drain region 5.

When etching the silicon oxide film 31 entirely, a silicon oxide film 31 of I nm to 10 nm is formed as shown in FIG. 19.

Thereafter, in the same manner as in the second preferred embodiment, the polysilicon plugs 23 and 24 are formed, and the nitride and oxide films 12 and 13, the silicon nitride film 13, the trench 15, the storage node contact 17, and the capacitor 22 are formed in the same manner as in the second embodiment.

In the manufacturing method of the semiconductor device according to the third preferred embodiment of the present invention, since the trench 8 is formed in a self-aligned manner on a part of the source/drain region 6, any pollution on the surface of the source/drain regions is removed by simple steps, and an area of the n-p junction is reduced, whereby a defective junction is restrained. In addition, as any stress concentrated on the source/drain region 6 in the vicinity of the end of the isolating oxide film 2 and on the p-type semiconductor substrate 1 is reduced, leakage current can be reduced, and the refresh pause time can be prolonged.

Further, since the trench 8 and the silicon oxide film 31 are formed also in the part where the source/drain region 5 is formed in the same manner as the source/drain region 6, not only is the n-p junction area between the p-type semiconductor substrate 1 and the source/drain region 5 reduced, thereby reducing a defective junction, but also any pollution on the surface of the source/drain region 5 is removed, and advantages are achieved such that a defective junction is restrained, leakage current can be reduced, and drive performance is improved.

When forming the mask used at the time of forming the trench 8 so as to expose only the surface of the source/drain region 6 as shown in FIG. 24, the trench 8 is not formed on the source/drain region 5, whereby the punch-through resistance can be improved.

A semiconductor device according to a fourth preferred embodiment of the present invention and a manufacturing method thereof are hereinafter described.

FIGS. 25 to 28 are sectional views showing the semiconductor device according to the fourth preferred embodiment of the present invention. Referring to FIGS. 25 to 28, reference numeral 33 is a trench. In FIGS. 25 to 28, like reference numerals are designated to the same parts as or equivalents in the foregoing first preferred embodiment.

Figure 25:
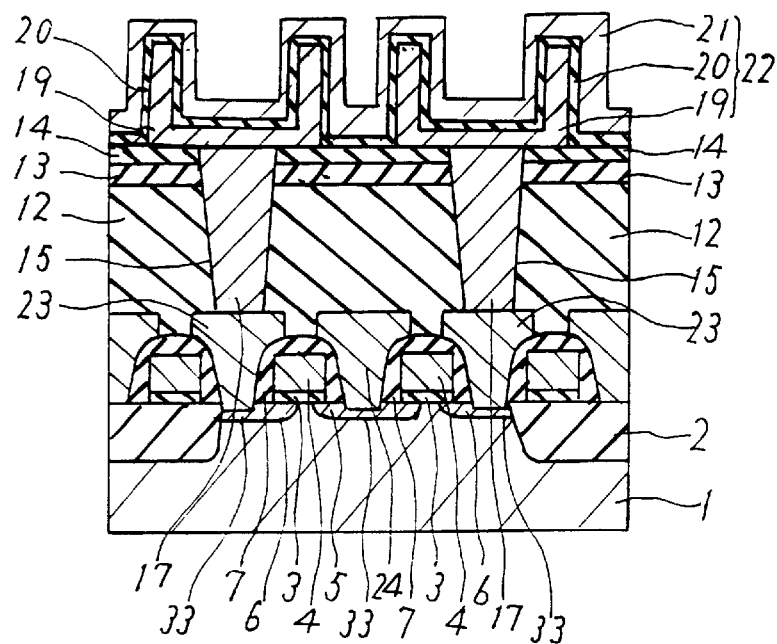
FIGS. 25 to 28 are sectional views showing a semiconductor device according to a fourth preferred embodiment of the present invention.

Referring to FIG. 25, in this semiconductor device the trench 33 is formed on a part of the source/drain regions 5 and 6 in such a manner as to be shallower than the n-p junction between the source/drain regions 5, 6 and the p-type semiconductor substrate 1.

In the semiconductor device shown in FIG. 25 as an example according to the fourth embodiment of the present invention, as a result of forming the trench 33, a surface of a part of the source/drain regions 5 and 6 is etched and removed, and not only can a defective junction due to pollution around the surface be prevented, but also stress concentrated on the source/drain region 6 in the vicinity of ends of the isolating oxide film 2 or on the p-type semiconductor substrate 1 is reduced, whereby leakage current is reduced.

Further, if a fluoride and oxide film is employed as an interlayer insulating film, for example, and a dielectric constant of this fluoride and oxide film is low as compared with the silicon oxide film, the interlayer parasitic capacity can be reduced, whereby it is possible to improve the operating speed of the transistor.

Figure 26:
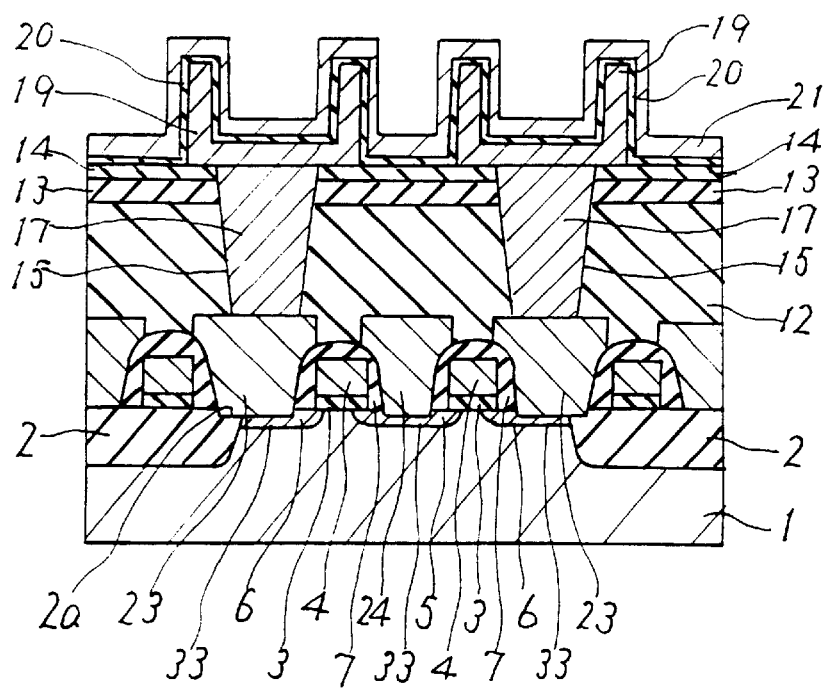

It is also preferred that, as shown in FIG. 26, a part 2a of the surface of the end of the isolating oxide film 2 is cut to form the polysilicon plug 23 thereat.

In the semiconductor device shown in FIG. 26 as another example according to the fourth embodiment of the present invention, since the part 2a of the end of the isolating oxide film 2 is etched and removed, the area of the polysilicon plug 23 can be larger as compared with the junction area between the source/drain region 6 and the polysilicon plug 23. Accordingly, as the contact resistance becomes small, write efficiency is improved, and thus it becomes possible to improve reliability in spite of having a fine structure.

Furthermore, as a result of removing the part 2a of the surface of the end of the isolating oxide film 2, a junction is formed between the source/drain region 6 and the semiconductor substrate 1, and distribution of an impurity concentration varies gently from the source/drain region 6 to the junction position, which results in a low electric field. When the electric field is low, a leakage current due to defects is restrained, and the refresh pause time can be prolonged.

Figure 29:
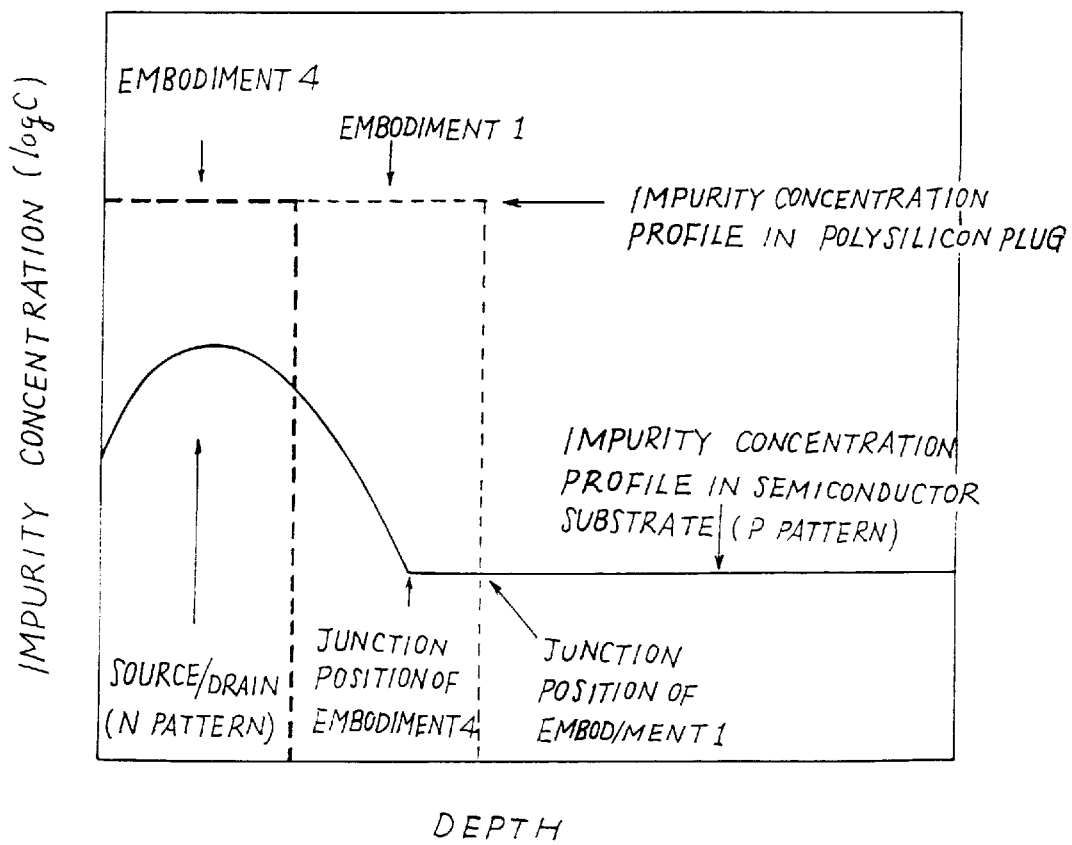
FIG. 29 is a graph to explain a relation between depth and impurity concentration of the semiconductor substrate according to the first and fourth preferred embodiments of the present invention.

This advantage is hereinafter described in detail with reference to a graph of FIG. 29 showing a relation between depth of the semiconductor substrate 1 and impurity concentration.

The field strength at the n-p junction is decided depending on the junction concentration and the inclination of the distribution of impurity concentration. Generally, when the junction concentration is low, the electric field is low. Further, when the distribution of impurity concentration to the junction is gently sloped, the electric field is low. In a case of the first preferred embodiment, the polysilicon plug 10 and the semiconductor substrate 1 form the junction. As the distribution of impurity concentration varies sharply from the polysilicon plug 10 to the junction position, the electric field is high. On the other hand, in case of the fourth preferred embodiment, the source/drain regions 5, 6 and the semiconductor substrate 1 form the junction. As the distribution of impurity concentration varies gently from the source/drain regions 5, 6 to the junction position, the electric field is low. When the electric field is low, any leakage current due to defects is reduced, and the refresh pause time is prolonged, in other words, characteristics of refresh can be improved.

Figure 27:
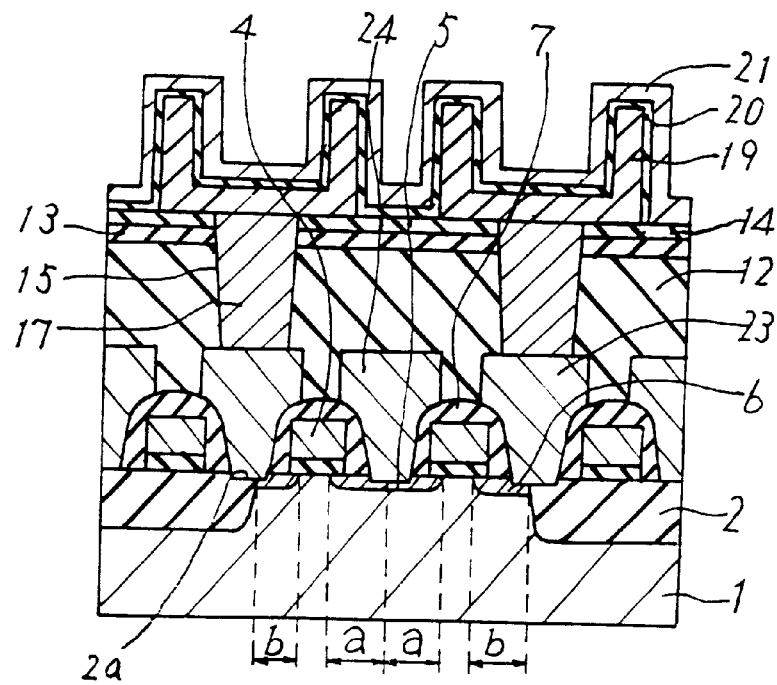

Then, as shown in FIG. 27, on the supposition that the length of the source/drain region 5 per transistor is "a" and the length of the source/drain region 6 is "b", when a≧b an area of the memory cell can be reduced as much as a shortened length of the source/drain region 6. Further, as an area for connecting the polysilicon plug 23 and the source/drain region 6 becomes smaller, any leakage current due to defects is reduced, and the refresh pause time can be prolonged, and additionally an advantage is achieved such that as the contact area can be larger, write efficiency is not lowered. In addition, as the source/drain region 5 is common for two transistors adjacent to each other, the length of the source/drain region 5 per transistor is "a".

Figure 28:
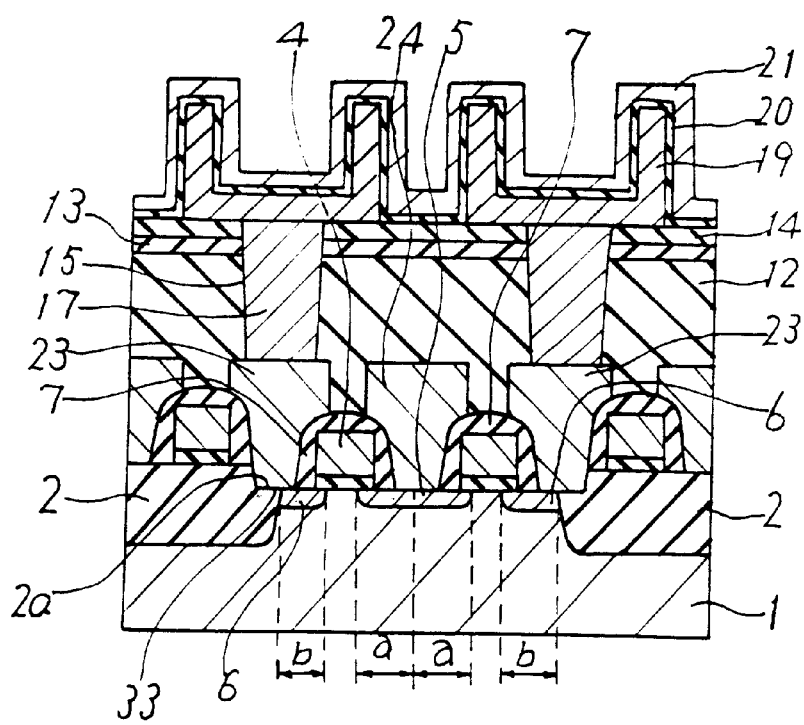

Further, as shown in FIG. 28, when the surface of the isolating oxide film 2 is formed higher than the main surface of the p-type semiconductor substrate 1 and the source/drain regions 5 and 6 are formed very shallow, as it is difficult to make the etching depth in a wafer even and shallower than the p-n junction between the source/drain regions 5 and 6 and the p-type semiconductor substrate 1, it is also preferred that the trench 33 is formed by cutting only the part 2a of the surface of the end of the isolating oxide film 2.

In the semiconductor device shown in FIGS. 27 and 28 as further examples according to the fourth embodiment of the present invention, an area for connecting the source/drain region 6 and the polysilicon plug 23 is reduced, and thereby leakage current can be even further restrained, and the refresh pause time can be prolonged. Further, as the part 2a of the surface of the end of the isolating oxide film 2 is removed, the same advantages as described with reference to FIG. 26 are achieved.

Figure 30:
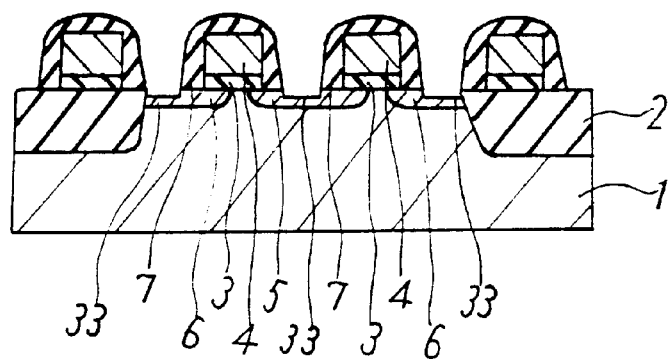
FIG. 30 is a sectional view showing a step of a manufacturing method of the semiconductor device shown in FIG. 25.
Figure 31:
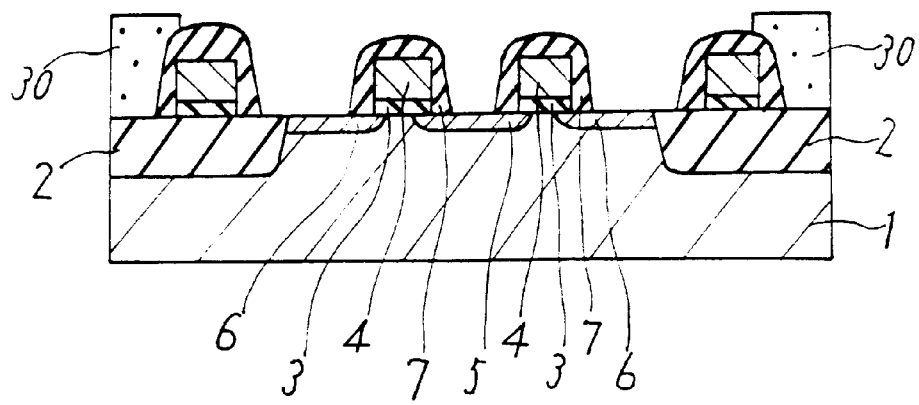
FIGS. 31 and 33 are sectional views showing a step of a manufacturing method of the semiconductor device shown in FIG. 26.
Figure 32:
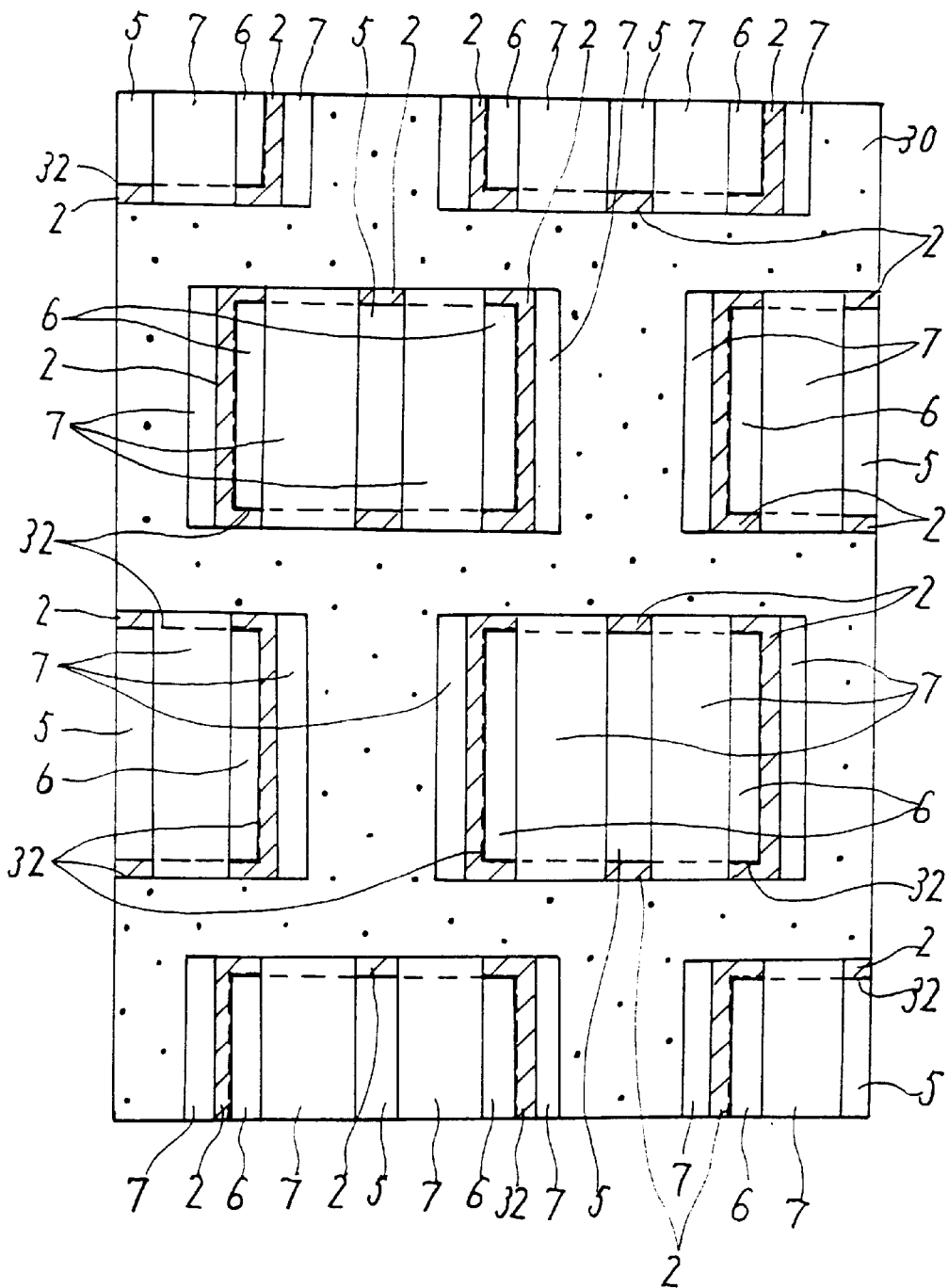
FIG. 32 is a plan view showing a step of a manufacturing method of the semiconductor device shown in FIG. 26.
Figure 33:
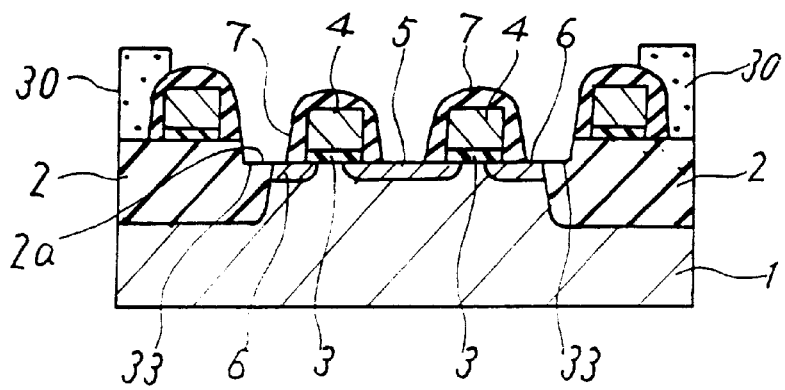

FIGS. 30 to 33 are views showing steps of a manufacturing method of the semiconductor device according to the fourth embodiment of the present invention, and in which FIGS. 30, 31 and 33 are sectional views and FIG. 32 is a plan view.

First, the manufacturing method of the semiconductor device shown in FIG. 25 is hereinafter described.

In the same manner as in the first preferred embodiment, the isolating oxide film 2, the gate oxide film 3, the gate electrode 4, the source/drain regions 5 and 6, and the side wall 7 are formed on the semiconductor substrate 1. Then, as shown in FIG. 30, the trench 33 which is shallower than the source/drain regions 5 and 6 is formed in a self-aligned manner by a silicon etching material capable of securing a large selection ratio to the silicon oxide film. Phosphorus ion is then injected into the entire surface so that the p-n junction between the source/drain regions 5 and 6 and the p-type semiconductor substrate 1 is deeper than the bottom surface of the trench 33.

Thereafter, in the same manner as in the second preferred embodiment, the polysilicon plugs 23 and 24 are formed, and the nitride and oxide films 12 and 13, the silicon nitride film 14, the trench 15, the storage node contact 17, and the capacitor 22 are formed in the same manner as in the second preferred embodiment, and thus the semiconductor device shown in FIG. 25 is formed.

In the semiconductor device shown in FIG. 25 as an example according to the fourth embodiment of the present invention, since the trench 33 is formed in a self-aligned manner, a surface of a part of the source/drain regions 5 and 6 is removed by etching in a simple process, and a defective junction due to pollution around the surface can be prevented. As a result, stress concentrated on the source/drain region 6 in the vicinity of the end of the isolating oxide film 2 and on the p-type semiconductor substrate 1 is reduced, whereby it becomes possible to obtain a semiconductor device in which leakage current is reduced.

The manufacturing method of the semiconductor device shown in FIG. 26 is now hereinafter described.

In the same manner as in the first preferred embodiment, the isolating oxide film 2, the gate oxide film 3, the gate electrode 4, the source/drain regions 5 and 6, and the side wall 7 are formed. This side wall 7 is formed of a silicon nitride and oxide film (SiON).

As shown in FIG. 31, the isolating oxide film 2 is masked with the resist 30 in such a manner as to coat the surface other than at an end. FIG. 32 is a plan view showing that the mentioned steps have been completed. Then, the source/drain regions 5 and 6 and the surface of the isolating oxide film 2 are removed by etching using the side wall 7 and the resist 30 as masks, whereby the trench 33 which is shallower than the source/drain regions 5 and 6 and in which the part 2a of the surface of the end of the isolating oxide film 2 is formed as shown in FIG. 26. Thereafter, phosphorus ion is injected into the entire surface so that the n-p junction between the source/drain regions 5 and 6 and the p-type semiconductor substrate 1 is deeper than the bottom surface of the trench 33.

Since the etching is performed using the side wall 7 and the resist 30 formed of the silicon nitride and oxide film (SiON) as the mask, the end of the isolating oxide film 2 of the portion in contact with the source/drain region 6 is removed in a self-matching manner. As the contact area of the source/drain region 6 can be secured to be larger and contact resistance becomes small, write efficiency is improved, and thus it becomes possible to achieve a manufacturing method of a semiconductor device in which reliability is improved in spite of having a fine structure. Further, as the part 2a of the surface of the end of the isolating oxide film 2 is removed, the same advantages as described with reference to FIG. 26 are achieved.

Then, on the supposition that a length of the source/drain region 5 per transistor is "a" and a length of the source/drain region 6 is "b", when a≧b the semiconductor device shown in FIG. 27 is formed. An area of the memory cell can be reduced as much as the shortened length of the source/drain region 6. Further, as the area for connecting the polysilicon plug 23 and the source/drain region 6 becomes smaller, leakage current due to defects is reduced, and the refresh pause time can be prolonged. In addition, as the source/drain region 5 is common for two transistors adjacent to each other, the length of the source/drain region 5 per transistor is "a".

Even when the surface of the isolating oxide film 2 is formed higher than the principal surface of the p-type semiconductor substrate 1 and the source/drain regions 5 and 6 are formed very shallow, after forming the isolating oxide film 2, the gate oxide film 3, the gate electrode 4, and the source/drain regions 5 and 6 in the same manner as in the first preferred embodiment, the side wall 7 is formed by etching back the silicon nitride and oxide film formed on the entire surface.

Then, as shown in FIG. 33, a masking is performed with the resist 30. The gate electrode 4 formed on the isolating oxide film 2 and the side wall 7 are formed near the center of the isolating oxide film 2 with a distance from the boundary between the isolating oxide film 2 and the active region. Accordingly, when etching in a self-matching manner by a silicon etching material capable of securing a large selection ratio to the silicon oxide film, only the end of the isolating oxide film 2 is removed. In this manner, the trench 33 is formed.

Thereafter, in the same manner as in the second preferred embodiment, the polysilicon plugs 23 and 24 are formed, and the nitride and oxide films 12 and 13, the silicon nitride film 14, the trench 15, the storage node contact 17, and the capacitor 22 are formed in the same manner as in the second preferred embodiment, and thus the semiconductor device shown in FIG. 28 is formed.

In the semiconductor device shown in FIG. 28 as an example according to the fourth embodiment of the present invention, since the end of the isolating oxide film 2 is removed even when the surface of the isolating oxide film 2 is formed higher than the surface of the p-type semiconductor substrate 1 and the source/drain regions 5 and 6 are formed very shallow, a semiconductor device, in which an area for connecting the source/drain region 6 and the polysilicon plug 23 is reduced, leakage current is restrained, and the refresh pause time is prolonged, can be formed by simple steps. Further, by removing the part 2a of the surface of the end of the isolating oxide film 2, the source/drain region 6 and the semiconductor substrate 1 form a junction. Accordingly, distribution of the impurity concentration varies gently from the source/drain regions to the junction position, which results in a low electric field. When the electric field is low, any leakage current due to defects is restrained, and the refresh pause time can be prolonged.

Although the bottom surface of the trench 33 formed by cutting the end of the isolating oxide film 2 is coincident to the surface of the source/drain region 6 in FIG. 33, the same advantages are achieved even if there is no coincidence between these surfaces.

Although the present invention has been described and illustrated in detail, it is clearly understood that the same is by way of illustration and example only and is not to be taken by way of limitation, the spirit and scope of the present invention being limited only by the terms of the appended claims.

Obviously, numerous additional modifications and variations of the present invention are possible in light of the above teachings. It is therefore to be understood that within the scope of the appended claims, the present invention may be practiced otherwise than as specifically described herein.

The present application is based on Japanese priority document 9-326393, the contents of which are incorporated herein by reference.

What is claimed is:

1. A semiconductor device comprising:

a semiconductor substrate;

an isolating insulation film formed on an isolated region of a main surface of said semiconductor substrate;

a pair of source/drain regions formed in an active region surrounded by the isolated region of the main surface of said semiconductor substrate;

a gate electrode formed on a main surface of the active region of said semiconductor substrate through a gate insulating film;

at least one interlayer insulating film formed to coat said isolating insulation film, said source/drain regions, and said gate electrode;

a wiring layer formed by filling up a contact hole reaching said source/drain regions through an opening provided on said at least one interlayer insulating film;

a capacitor connected to one of said pair of source/drain regions through said wiring layer; and a semiconductor film restraining a leakage current formed in said wiring layer so as not to contact said capacitor.

2. A semiconductor device as defined in claim 1, wherein said wiring layer and said semiconductor film are both composed of polycrystal silicon, and an impurity concentration of said semiconductor film is lower than an impurity concentration of said wiring layer.

3. A semiconductor device as defined in claim 1, wherein said semiconductor film is formed of silicon carbide.

* * * * *